(12) United States Patent
Nakao et al.

(10) Patent No.: US 10,886,372 B2
(45) Date of Patent: *Jan. 5, 2021

(54) SILICON CARBIDE SEMICONDUCTOR DEVICE

(71) Applicant: Mitsubishi Electric Corporation, Chiyoda-ku (JP)

(72) Inventors: Yukiyasu Nakao, Tokyo (JP); Masayuki Imaizumi, Tokyo (JP); Shuhei Nakata, Tokyo (JP); Naruhisa Miura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/525,820

(22) Filed: Jul. 30, 2019

(65) Prior Publication Data

US 2019/0355821 A1 Nov. 21, 2019

Related U.S. Application Data

(60) Continuation of application No. 14/245,539, filed on Apr. 4, 2014, which is a division of application No.
(Continued)

(30) Foreign Application Priority Data

Feb. 24, 2009 (JP) .................................. 2009-040719

(51) Int. Cl.
*H01L 29/16* (2006.01)
*H01L 29/66* (2006.01)
(Continued)

(52) U.S. Cl.
CPC ...... *H01L 29/1608* (2013.01); *H01L 21/0465* (2013.01); *H01L 29/1095* (2013.01);
(Continued)

(58) Field of Classification Search
CPC ............. H01L 29/1608; H01L 29/7816; H01L 29/7396; H01L 29/7811; H01L 29/1095;
(Continued)

(56) References Cited

U.S. PATENT DOCUMENTS 5,169,793 A 12/1992 Okabe et al.
5,464,992 A 11/1995 Okabe et al.
(Continued)

FOREIGN PATENT DOCUMENTS

DE 20 2004 021 352 U1 9/2007
JP 04-229661 8/1992
(Continued)

OTHER PUBLICATIONS

International Search Report dated Apr. 20, 2010 in PCT/JP10/52667 filed Feb. 23, 2010.
(Continued)

*Primary Examiner* — Galina G Yushina
(74) *Attorney, Agent, or Firm* — Xsensus LLP

(57) ABSTRACT

A SiC semiconductor device capable of increasing a switching speed without destroying a gate insulating film. In addition, in a SiC-MOSFET including an n-type semiconductor substrate formed of SiC, a p-type semiconductor layer is entirely or partially provided on an upper surface of a p-type well layer that has a largest area of the transverse plane among a plurality of p-type well layers provided in an n-type drift layer and is arranged on an outermost periphery below and horizontally overlapping a gate electrode pad. It is preferable that a concentration of an impurity contained in the p-type semiconductor layer be larger than that of the p-type well layer.

6 Claims, 38 Drawing Sheets

Related U.S. Application Data

13/146,812, filed as application No. PCT/JP2010/052667 on Feb. 23, 2010, now Pat. No. 8,723,259.

(51) Int. Cl.

| | | |
|---|---|---|
| *H01L 29/10* | (2006.01) | |
| *H01L 29/06* | (2006.01) | |
| *H01L 29/423* | (2006.01) | |
| *H01L 21/04* | (2006.01) | |
| *H01L 29/739* | (2006.01) | |
| *H01L 29/78* | (2006.01) | |
| *H01L 29/45* | (2006.01) | |

(52) U.S. Cl.
CPC .... *H01L 29/66068* (2013.01); *H01L 29/7396* (2013.01); *H01L 29/7811* (2013.01); *H01L 29/7816* (2013.01); *H01L 29/0615* (2013.01); *H01L 29/0657* (2013.01); *H01L 29/0696* (2013.01); *H01L 29/42372* (2013.01); *H01L 29/45* (2013.01)

(58) Field of Classification Search
CPC ........... H01L 21/0465; H01L 29/66068; H01L 29/42372; H01L 29/45; H01L 29/0657; H01L 29/0696; H01L 21/0615
See application file for complete search history.

(56) References Cited

U.S. PATENT DOCUMENTS

| | | | |
|---|---|---|---|
| 5,545,908 A | 8/1996 | Tokura et al. | |
| 5,686,750 A | 11/1997 | Takahashi | |
| 6,930,355 B2 * | 8/2005 | Matsuki | H01L 23/4824 |
| | | | 257/341 |
| 7,221,010 B2 | 5/2007 | Ryu | |
| 7,679,132 B2 | 3/2010 | Yoshie | |
| 8,084,342 B2 | 12/2011 | Snyder et al. | |
| 10,418,444 B2 * | 9/2019 | Nakao | H01L 29/1095 |
| 2003/0006497 A1 | 1/2003 | Hiyoshi et al. | |
| 2003/0214012 A1 | 11/2003 | Kelberlau | |
| 2006/0244060 A1 | 11/2006 | Kapels et al. | |
| 2008/0099857 A1 | 5/2008 | Furuta et al. | |
| 2008/0224149 A1 | 9/2008 | Yoshie | |
| 2008/0224150 A1 * | 9/2008 | Suzuki | H01L 21/0465 |
| | | | 257/77 |
| 2009/0020834 A1 | 1/2009 | Ootsuka et al. | |

FOREIGN PATENT DOCUMENTS

| | | |
|---|---|---|
| JP | 05-041523 | 2/1993 |
| JP | 05-198816 | 8/1993 |
| JP | 08-102495 | 4/1996 |
| JP | 2002-076337 | 3/2002 |
| JP | 2003-023158 | 1/2003 |
| JP | 2003-243654 | 8/2003 |
| JP | 2004-273647 | 9/2004 |
| JP | 2008-235331 | 10/2008 |
| WO | 2006-123458 | 11/2006 |

OTHER PUBLICATIONS

Office Action dated Aug. 20, 2013, in Japanese Patent Application No. 2011-501583 (w/partial English-language translation).
Office Action dated Apr. 30, 2013 in German Patent Application No. 11 2010 000 882.5 (w/English language translation).
International Preliminary Report on Patentability dated Sep. 9, 2011 and the Written Opinion of the International Searching authority dated Apr. 20, 2010, in PCT/JP2010/052667 (w/English-language translation).
Office Action dated Mar. 17, 2015 in Japanese patent Application No. 2014-083483 (w/English translation).

* cited by examiner

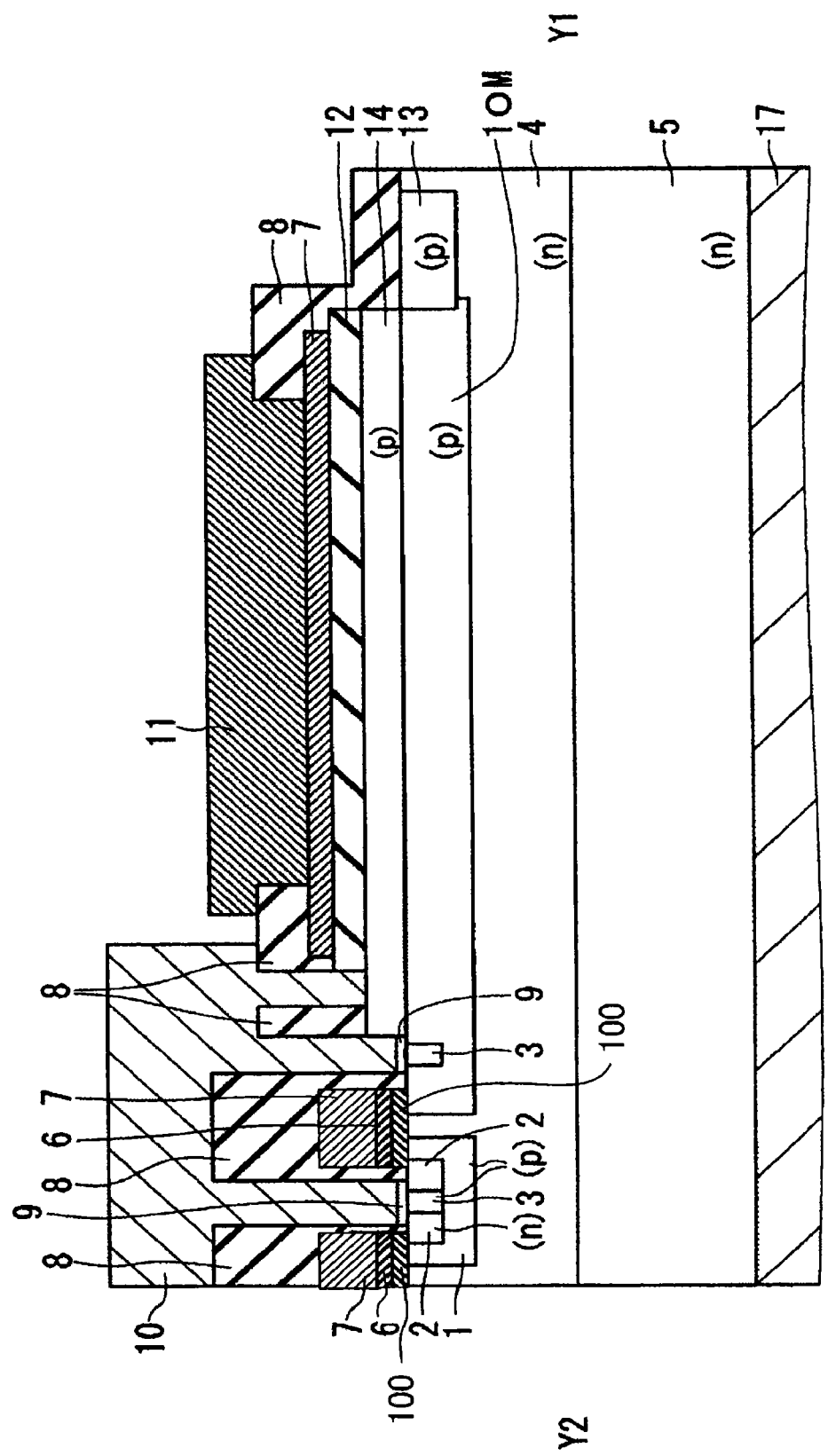

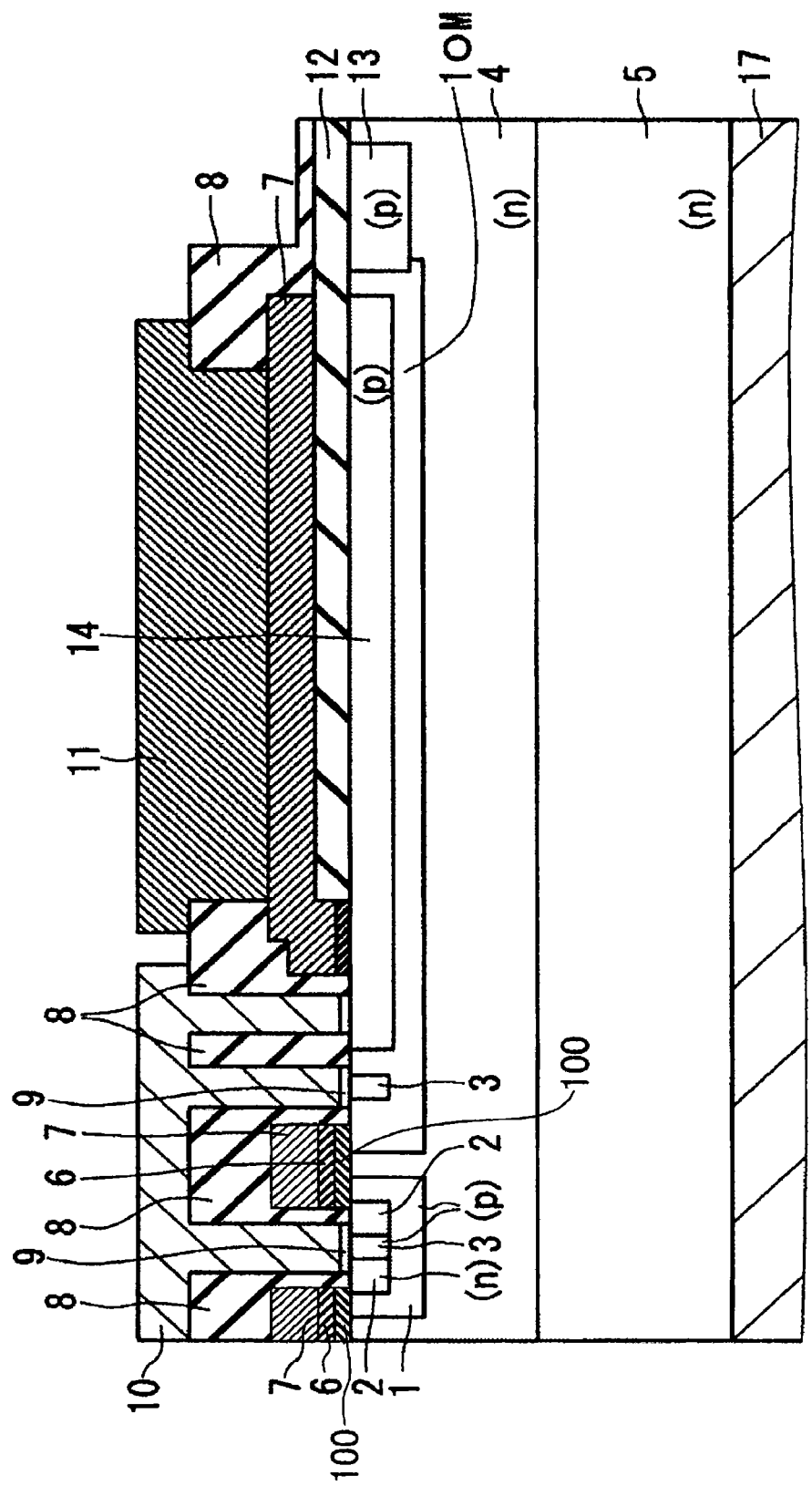

SILICON CARBIDE SEMICONDUCTOR DEVICE

CROSS-REFERENCE TO RELATED APPLICATIONS

This application is a continuation of and claims the benefit of priority under 35 U.S.C. § 120 from U.S. application Ser. No. 14/245,539 filed Apr. 4, 2014, which is a division of U.S. application Ser. No. 13/146,812 filed Jul. 28, 2011 (now U.S. Pat. No. 8,723,259 issued May 13, 2014), the entire contents of each of which are incorporated herein by reference. U.S. application Ser. No. 13/146,812 is a National Stage of International Application No. PCT/JP2010/052667 filed Feb. 23, 2010, which claims the benefit of priority from Japanese Patent Application No. 2009-040719 filed Feb. 24, 2009.

TECHNICAL FIELD

The present invention relates to a silicon carbide semiconductor device used as a power semiconductor device.

BACKGROUND ART

As already known, an IGBT or a vertical MOSFET (There are cases in which a MOS structure is a planar type or a trench type), which is a typical example of a power semiconductor device (power device) having a MOS structure, is used, for example, as a switching element in an inverter circuit. This type of power device has a very thin gate insulating film as compared with a field oxide film or the like.

Here, a vertical power MOSFET described in Patent Document 1 is a device using Si as a semiconductor substrate material. As illustrated in FIGS. 1 and 2 in Patent Document 1, in an adjacent region on a side of a cell region of a MOSFET adjacent to a periphery of the cell region of the MOSFET (including a gate pad), minute diodes are arranged at least in one row along the periphery. Each of such diodes arranged in one row in the region between the gate pad and the cell region of the MOSFET absorbs holes that are injected from a P-well and a P-base into an N-type semiconductor layer on a drain side upon applying a forward bias when the MOSFET is switched from an ON state to an OFF state as illustrated in FIG. 3 of Patent Document 1. For this reason, the structure described in Patent Document 1 can prevent a parasitic transistor illustrated in FIG. 3 of Patent Document 1 from turning on when the MOSFET is switched from a forward bias to a reverse bias. In addition, in the structure described in Patent Document 1, the P-base which is the P-well of a MOSFET cell is electrically connected to a source electrode through a back gate as illustrated in FIG. 2 of Patent Document 1.

PRIOR ART DOCUMENT

Patent Document

Patent Document 1: Japanese Patent Application Laid-Open No. 05-198816 (1993) (FIGS. 1 to 3)

SUMMARY OF THE INVENTION

Problem to be Solved by the Invention

The problem to be solved by the present invention will be described below with reference to FIG. 2 of Patent Document 1.

Now, when a MOSFET cell which is a switching element switches from an ON state to an OFF state, a drain voltage of the MOSFET cell, that is, a voltage of a drain electrode, rapidly increases and changes from about 0 volt to several hundred volts. Then, a displacement current flows into a P-well through a parasitic capacitance present between the P-well and an N-type drain layer. As described below, although this displacement current flows into the source electrode, this is the same for the case in which the P-well that forms the parasitic capacitance between itself and the N-type drain layer is a P-well of the MOSFET cell, a P-well of a diode cell, or a P-well located below a gate pad or below a gate finger mechanically connected to the gate pad.

Here, it should be noted that, when an area of a transverse plane of the P-well of the MOSFET cell is compared with an area of a transverse plane of the P-well of the diode cell, the area of the transverse plane of the P-well below the gate pad or below the gate finger is very large. Consequently, an electric resistance value in the P-well below the gate pad or below the gate finger becomes a very large value as compared with an electric resistance value of the P-well of the MOSFET cell and an electric resistance value of the P-well of the diode cell.

In Patent Document 1, since the source electrode and a field plate illustrated in a longitudinal sectional view in a section (C) of FIG. 2 are electrically connected to each other, the displacement current flowed into the P-well below the gate pad or below the gate finger during switching flows, inside the P-well below the gate pad or below the gate finger, from a portion on a side of the MOSFET cell toward a portion of a contact hole connected to the field plate, and flows into the source electrode through the field plate.

As described above, the area of the transverse plane of the P-well below the gate pad or below the gate finger is very large as compared with the areas of the transverse planes of other P-wells. However, since resistances are present in the P-well itself and the contact hole, when the displacement current flows in the P-well having a large area of the transverse plane and located below the gate pad or below the gate finger, a potential drop of a value that cannot be ignored is generated in the P-well.

As a result of this, a portion having a large distance in a horizontal direction from a portion (a portion immediately below the contact hole) which is electrically connected to the source electrode through the contact hole and the field plate in the P-well has a relatively large potential. Additionally, this potential becomes larger as a fluctuation of a drain voltage V relative to a time t, that is, dV/dt, becomes larger.

For this reason, as illustrated in the section (C) of FIG. 2 of Patent Document 1, in the case where the gate electrode is provided, through a gate insulating film, in a portion of a side edge of the cell that is farthest from the contact hole in the P-well below the gate finger connected to the gate pad, an electric field having a large strength is applied to a gate insulating film between the gate electrode having a voltage value close to 0 volt in a state immediately after the MOSFET cell is switched from an ON state to an OFF state and the portion of the side edge of the cell of the P-well. This sometimes causes a breakdown of an electrical insulation of the gate insulating film.

Therefore, recently, it has been expected to reduce a loss in an inverter circuit by using, as an switching element of an inverter circuit, a SiC semiconductor device (for example, vertical MOSFET or IGBT) using, as a semiconductor substrate material, silicon carbide (SiC) having a band gap which is three times larger than that of Si used as a conventional semiconductor substrate material. In addition, a further high-speed driving of the switching element is demanded to achieve a further low loss. To state it differently, it is demanded to further quicken the fluctuation dV/dt of the drain voltage V relative to the time t to achieve a lower loss.

The structural problem that is pointed out with reference to Patent Document 1 is a problem that may be caused similarly even if Si as a conventional semiconductor substrate material is replaced with SiC described above. Furthermore, in the case where the semiconductor substrate material is SiC, it is demanded to further quicken the fluctuation dV/dt of the drain voltage V relative to the time t as described above. As a result, the value of the displacement current that flows into the P-well through the foregoing parasitic capacitance is also further increased.

Further, if the semiconductor substrate material is replaced with SiC, the following problem emerges. That is, in the switching element using SiC as the semiconductor substrate material, it is difficult to sufficiently lower a resistance of a semiconductor layer due to a large band gap of SiC as compared with a switching element using conventional Si as the semiconductor substrate material. Because of this, if SiC is used as the semiconductor substrate material, the value of the parasitic resistance of the P-well or the like described earlier becomes larger than the case where Si is used, and the value of the large parasitic resistance causes the potential generated in the P-well below the gate pad or below the gate finger to become further larger.

The present invention is made in view of findings of such problems and recognition of locations where the problems occur, and a primary object of the present invention is to suppress occurrence of dielectric breakdown between a gate electrode and a source electrode during switching or turning-off, increase a switching speed or a charging and discharging speed, and thereby achieving a lower loss in a SiC semiconductor device that has a MOS structure and functions as a switching element.

Means for Solving the Problem

A silicon carbide semiconductor device according to an aspect of the present invention includes: a silicon carbide semiconductor substrate; a drift layer of a first conductivity type provided on a main surface of the silicon carbide semiconductor substrate; a first well layer of a second conductivity type provided from an upper surface of the drift layer to an inner part of the drift layer and provided in a cell region in which a plurality of cells each functioning as a semiconductor element are formed, and a second well layer of the second conductivity type provided on a periphery of the cell region; a semiconductor layer of the second conductivity type provided in an upper layer of the second well layer; a gate insulating film and a field oxide film provided on the semiconductor layer; a gate electrode provided on the gate insulating film and the field oxide film; and a gate electrode pad provided immediately above the gate electrode.

Effects of the Invention

According to a silicon carbide semiconductor device according to the present invention, it is possible to suppress a potential distribution in a second well layer of a second conductivity type which is caused by an inflow of a displacement current generated during switching, particularly during turning off, so that the potential distribution is reduced. As a result, a potential difference between a gate electrode and the second well layer of the second conductivity type is reduced, which makes it possible to effectively prevent a breakdown of a gate insulating film. This allows the switching speed to be increased, a life of the device to be prolonged, and a low loss to be realized as a result of an increase in the switching speed. Consequently, it is further possible to promote a low consumption of power (saving of energy) of the device. Hereinafter, various embodiments of the present invention will be described in detail together with the effects and advantages thereof with reference to the accompanying drawings.

BRIEF DESCRIPTION OF THE DRAWINGS

FIG. 40 corresponds to the embodiment illustrated in FIG. 2 and includes a channel epitaxial layer 100.

FIG. 41 corresponds to the embodiment of FIG. 27, and includes a channel epitaxial layer 100.

EMBODIMENT FOR CARRYING OUT THE INVENTION

Embodiment 1

Hereinafter, description will be given of a structure, a manufacturing method, and evaluation of an n-type channel SiC-MOSFET as an example of a SiC semiconductor device according to the present embodiment.

Figure 1:
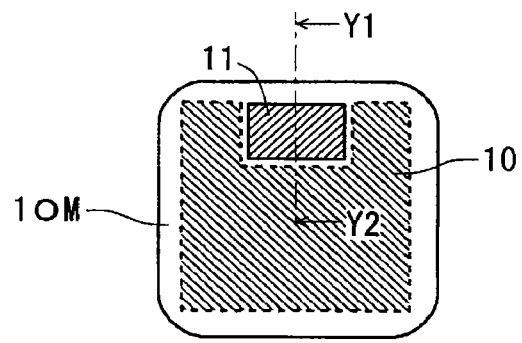
FIG. 1 is a plan view schematically illustrating an upper structure of a SiC-MOSFET according to Embodiment 1 of the present invention.
Figure 2:
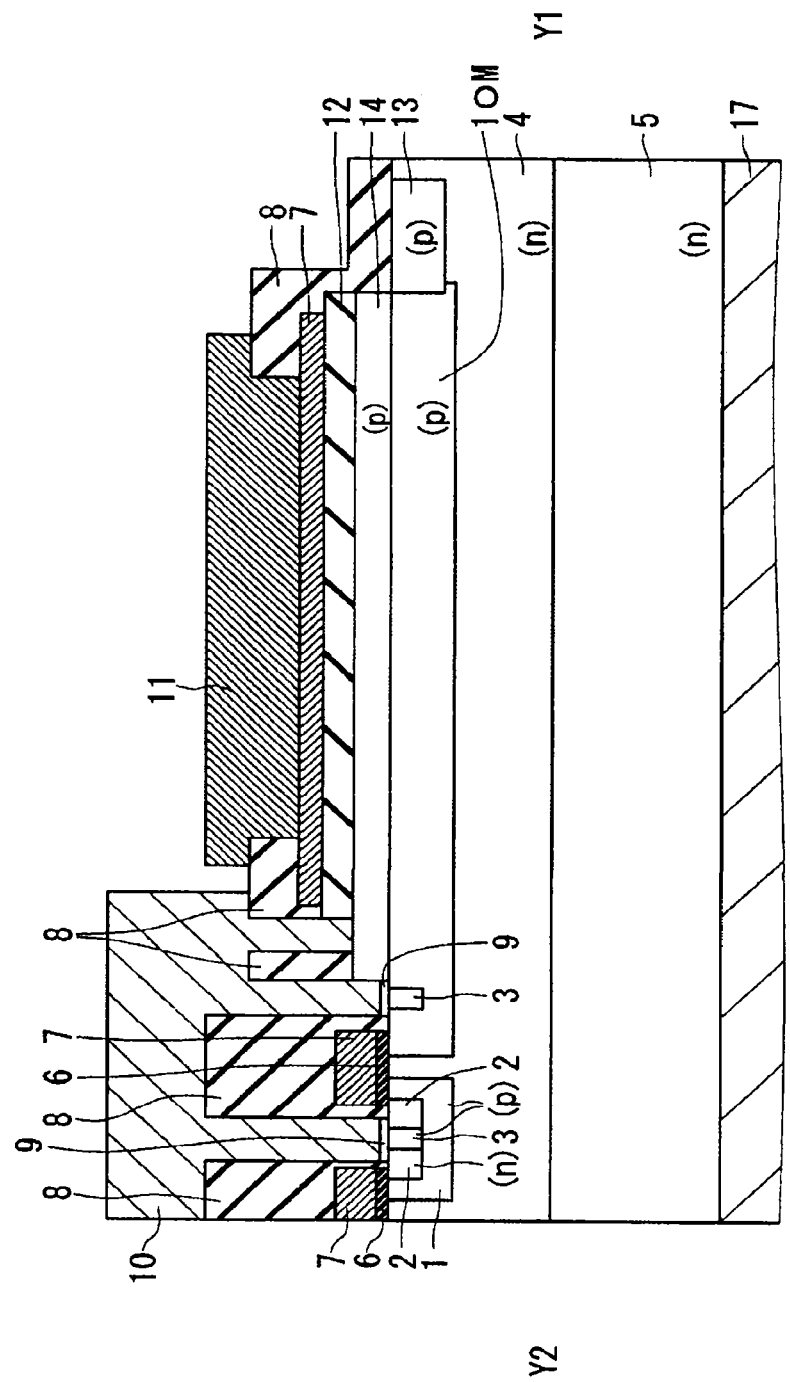
FIG. 2 is a longitudinal sectional view of the SiC-MOSFET according to Embodiment 1 of the present invention.

FIG. 1 is a plan view schematically illustrating an upper structure of a SiC-MOSFET according to the present embodiment. FIG. 2 is a longitudinal sectional view of the SiC-MOSFET illustrated in FIG. 1 taken along line Y1-Y2.

The structural feature of the SiC-MOSFET illustrated in FIGS. 1 and 2 is that a p-type semiconductor layer 14 is provided, entirely or partially, on an upper surface of a p-type well layer 1 (corresponding to a p-type well layer 1OM arranged on an outermost periphery and having the largest area of the transverse plane) located below and horizontally overlapping a gate electrode pad 11. By depositing the p-type semiconductor layer 14, a p-type layer located below and horizontally overlapping the gate electrode pad 11 is structured of a combination layer of the p-type well layer 1OM and the p-type semiconductor layer 14 thereabove.

Accordingly, a resistance of the p-type layer located below and horizontally overlapping the gate electrode pad 11 is reduced from an overall perspective. Therefore, a potential difference or an electrical resistance between an end portion as well as a vicinity thereof opposite to a side of a region of a MOSFET cell in which a plurality of MOSFET cells each functioning as a MOSFET are arranged among end portions of the p-type well 1OM located below and horizontally overlapping the gate electrode pad 11 and a vicinity portion of a well contact layer 3 of the p-type well layer 1OM located below and horizontally overlapping the gate electrode pad 11 is reduced.

As a result, a value of a voltage applied between the vicinity portion of the well contact layer 3 of the p-type well layer 1OM located below and horizontally overlapping the gate electrode pad 11 and a gate electrode polysilicon layer 7 is significantly reduced, and insulation properties of the gate insulating film 6 located below and horizontally overlapping the gate electrode polysilicon layer 7 are protected.

From such a perspective, as the resistivity of the p-type semiconductor layer 14 becomes lower, the foregoing operation and effect notably increase due to its presence. For example, a concentration of an impurity contained in the p-type semiconductor layer 14 is set to become larger than that of the p-type well layer 1OM located below and horizontally overlapping the gate electrode pad 11, and it is preferable that a range of the concentration of the impurity be set between $1\times10^{19}$ cm$^{-3}$ and $1\times10^{20}$ cm$^{-3}$. It is also preferable that a thickness of the p-type semiconductor layer 14 be set at, for example, about 100 nm or larger. However, a band gap of the p-type semiconductor layer 14 may be larger than, smaller than, or equal to that of the p-type well layer 1OM located below and horizontally overlapping the gate electrode pad 11.

The p-type semiconductor layer 14 which is a characterized portion is structurally and electrically connected to the gate electrode pad 11, and it is also preferable, in view of its operation and effect, that the p-type semiconductor layer 14 be entirely or partially provided, similarly, on an upper surface of the p-type well layer 1 (1OM) located below and horizontally overlapping the gate electrode finger (not illustrated) that is structurally and electrically connected to each gate electrode polysilicon layer 7.

In FIG. 2, the reference numerals represent the following constitutional elements. Specifically, 1 denotes a p-type well layer, 1OM denotes a p-type well layer (second well layer) on the outermost periphery, 2 denotes an n-type contact layer, 3 denotes a well contact layer, 5 denotes an n-type semiconductor substrate of SiC as a base material, 4 denotes an n-type drift layer provided on a main surface of the n-type semiconductor substrate 5, 6 denotes a gate insulating film formed of, for example, a silicon oxide film, 7 denotes a gate electrode polysilicon layer, 8 denotes an interlayer dielectric film, 9 denotes an NiSi layer, 10 denotes a source electrode, 11 denotes a gate electrode pad, 12 denotes a field oxide film, 13 denotes a JTE (Junction Termination Extension) layer, 14 denotes a p-type semiconductor layer, and 17 denotes a drain electrode, respectively. Here, the p-type well layer formed in the region of the MOSFET cell may be sometimes referred to as a first well layer, and the p-type well layer formed on an outer periphery of the region of the MOSFET cell may be sometimes referred to as a second well layer.

Referring to the structure illustrated in FIGS. 1 and 2, conductivity types of the semiconductor layers may be reversed. In this case, if the n-type conductivity is defined as a "first conductivity type", the p-type is defined as a "second conductivity type". When these conductivity types are reversed, the p-type conductivity becomes the "first conductivity type", and the n-type conductivity type becomes the "second conductivity type". In accordance with reversing the conductivity types, names of the electrodes excluding the gate electrode are also reversed. With regard to this point, the same also applies to Embodiments 2 and 3 that will be described later.

Next, referring to the longitudinal sectional views in FIGS. 3 to 17 sequentially illustrating the manufacturing steps, a manufacturing method of the SiC-MOSFET according to the present embodiment exemplified in FIGS. 1 and 2 will be described.

Figure 3:
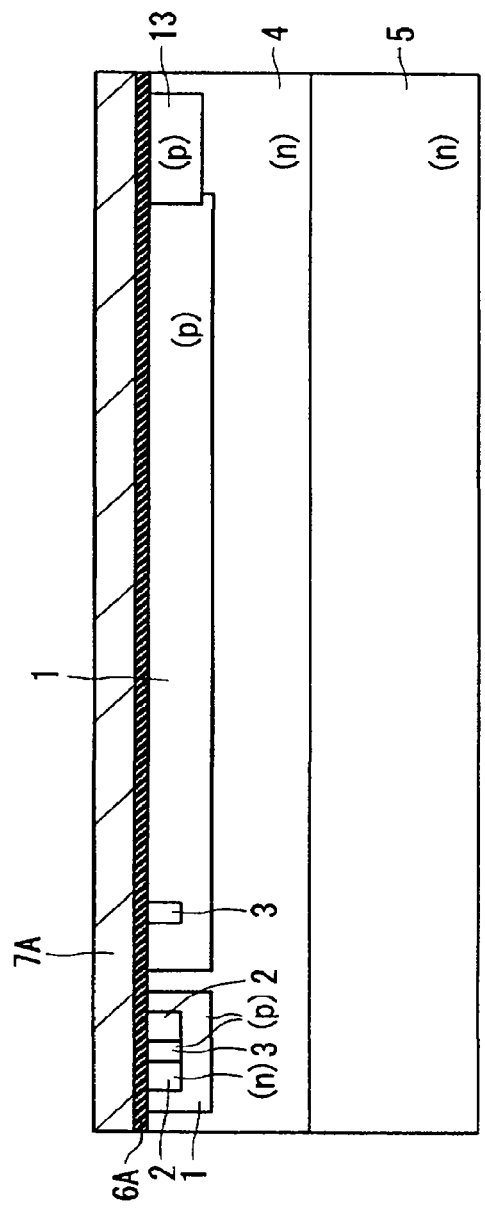
FIG. 3 is a longitudinal sectional view illustrating a manufacturing process of the SiC-MOSFET according to Embodiment 1 of the present invention.

First, referring to FIG. 3, the n-type drift layer 4 made of n-type silicon carbide is formed, by an epitaxial crystal growth method, on an upper surface (main surface) of the n-type semiconductor substrate 5 formed of silicon carbide.

For example, an n-type 4H-silicon carbide substrate is preferable as the n-type semiconductor substrate 5. In addition, nitrogen is doped in the n-type drift layer 4, and the nitrogen concentration is in a range not less than $5 \times 10^{15}$ cm$^{-3}$ and not more than $5 \times 10^{16}$ cm$^{-3}$. It is preferable that the thickness of the n-type drift layer 4 be in a range not less than 10 μm and not more than 15 μm. It should be noted that phosphorus may be doped instead of nitrogen.

After the n-type drift layer 4 is formed, a resist (not illustrated) is used as a mask, an impurity is ion-implanted in a position that is a predetermined distance away above an upper surface of the n-type drift layer 4, and a pair of the p-type well layers 1 is formed in the n-type drift layer 4.

Thereafter, the resist is removed. At this time, it is preferable that the concentration of the impurity be in a range not less than $1 \times 10^{18}$ cm$^{-3}$ and not more than $1 \times 10^{19}$ cm$^{-3}$, and the thickness of the p-type well layer 1 be in a range not less than 0.5 μm and not more than 1.5 μm. For example, boron (B) or aluminum (Al) is named as the p-type impurity.

Furthermore, an impurity is ion-implanted, using a resist (not illustrated) as a mask, in each of the p-type well layers 1 which is supposed to be present in the region of the MOSFET cell among the plurality of p-type well layers 1, and the n-type contact layer 2 is formed.

Thereafter, the resist is removed. At this time, it is preferable that the concentration of the impurity be in a range not less than $1 \times 10^{19}$ cm$^{-3}$ and not more than $1 \times 10^{20}$ cm$^{-3}$, and the thickness of the n-type contact layer 2 be in a range not less than 0.3 μm and not more than 0.8 μm. For example, phosphorus (P) or nitrogen (N) is named as the n-type impurity.

In addition, among the plurality of the p-type well layers 1, an impurity is ion-implanted, using a resist (not illustrated) as a mask, in the vicinity of the outermost periphery of the p-type well layer 1 to be located below and horizontally overlapping the gate electrode pad 11 illustrated in FIG. 2, thereby the p-type JTE layer 13 is formed, and thereafter the resist is removed. At this time, it is preferable that the concentration of the impurity be in a range not less than $1 \times 10^{17}$ cm$^{-3}$ and not more than $1 \times 10^{18}$ cm$^{-3}$, and the thickness of the p-type JTE layer 13 be in a range not less than 0.5 μm and not more than 1.5 μm. For example, boron (B) or aluminum (Al) is named as the p-type impurity.

Furthermore, impurity is ion-implanted, using a resist (not illustrated) as a mask, in each of the plurality of the p-type well layers 1, the p-type well contact layer 3 is formed, and thereafter, the resist is removed. At this time, it is preferable that the concentration of the impurity be in a range not less than $1 \times 10^{20}$ cm$^{-3}$ and not more than $1 \times 10^{21}$ cm$^{-3}$, and the thickness of the p-type well contact layer 3 be in a range not less than 0.3 μm and not more than 0.8 μm. For example, boron (B) or aluminum (Al) is named as the p-type impurity.

Next, activation of the n-type and p-type impurities which are ion-implanted will be performed. This is a process in which a wafer is subjected to annealing treatment under a high temperature by a heat treatment device and the implanted ions are electrically activated.

Alternatively, it is also possible to use the epitaxial crystal growth method to further deposit n-type SiC, perform patterning by using a resist (not illustrated) as a mask, and form an n-type channel epitaxial layer. It is preferable that the impurity to be doped in the n-type channel epitaxial layer be nitrogen, the concentration of nitrogen be in a range not less than than $1 \times 10^{16}$ cm$^{-3}$ and not more than $1 \times 10^{17}$ cm$^{-3}$, and the thickness of the n-type channel epitaxial layer be in a range not less than 0.3 μm and not more than 0.6 μm. Here, phosphorus may be doped instead of nitrogen.

After the annealing treatment, an upper surface of the n-type drift layer 4 is oxidized by thermal oxidation, whereby an insulating film 6A of SiO$_2$ film is formed on an entire wafer, and a p-type polysilicon film 7A is deposited on the insulating film 6A by a CVD method (FIG. 3).

Figure 4:
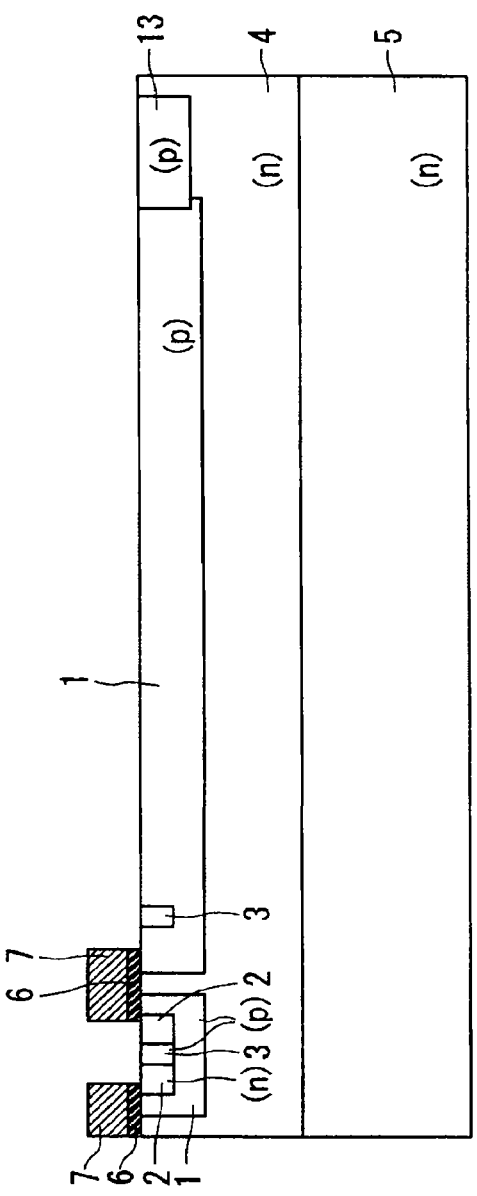
FIG. 4 is a longitudinal sectional view illustrating a manufacturing process of the SiC-MOSFET according to Embodiment 1 of the present invention.
Figure 5:
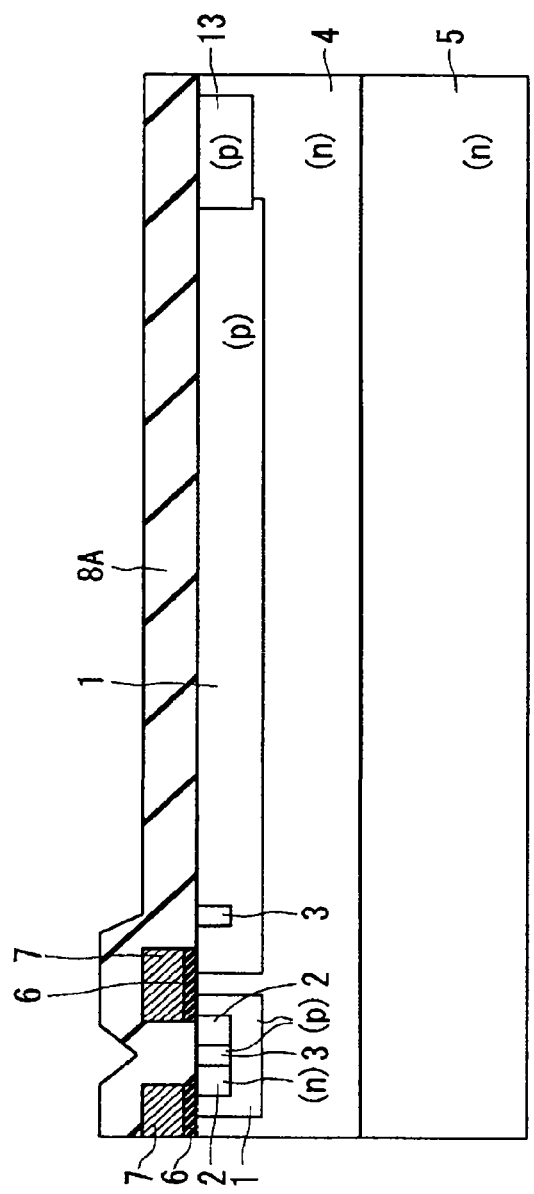
FIG. 5 is a longitudinal sectional view illustrating a manufacturing process of the SiC-MOSFET according to Embodiment 1 of the present invention.

After the p-type polysilicon film 7A is deposited, the p-type polysilicon film 7A is subjected to patterning, and the gate insulating film 6 and the gate electrode polysilicon layer 7 provided thereon are formed, as illustrated in FIG. 4.

Figure 6:
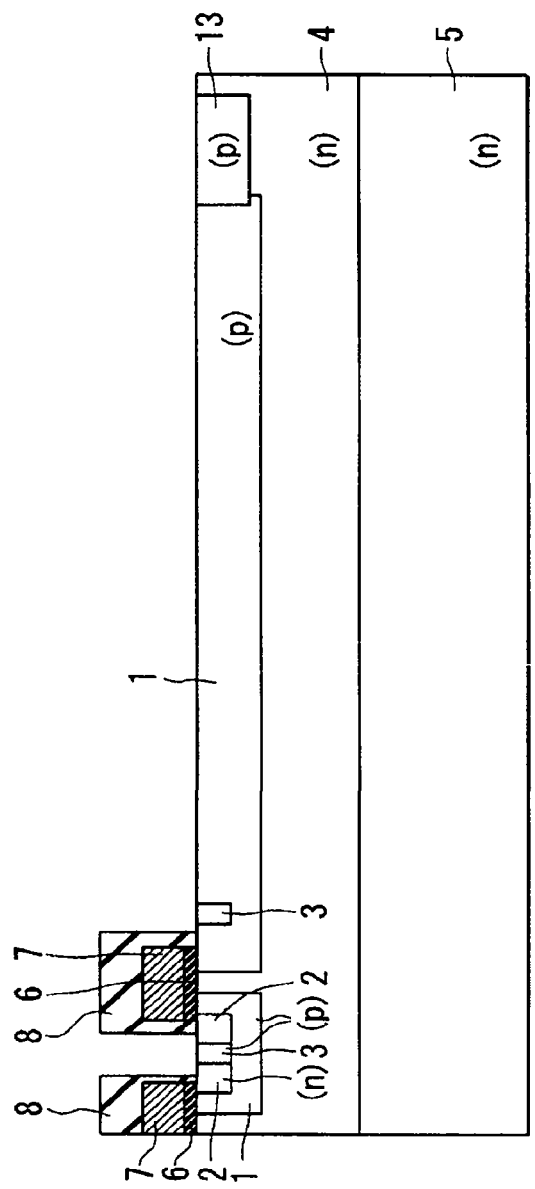
FIG. 6 is a longitudinal sectional view illustrating a manufacturing process of the SiC-MOSFET according to Embodiment 1 of the present invention.
Figure 7:
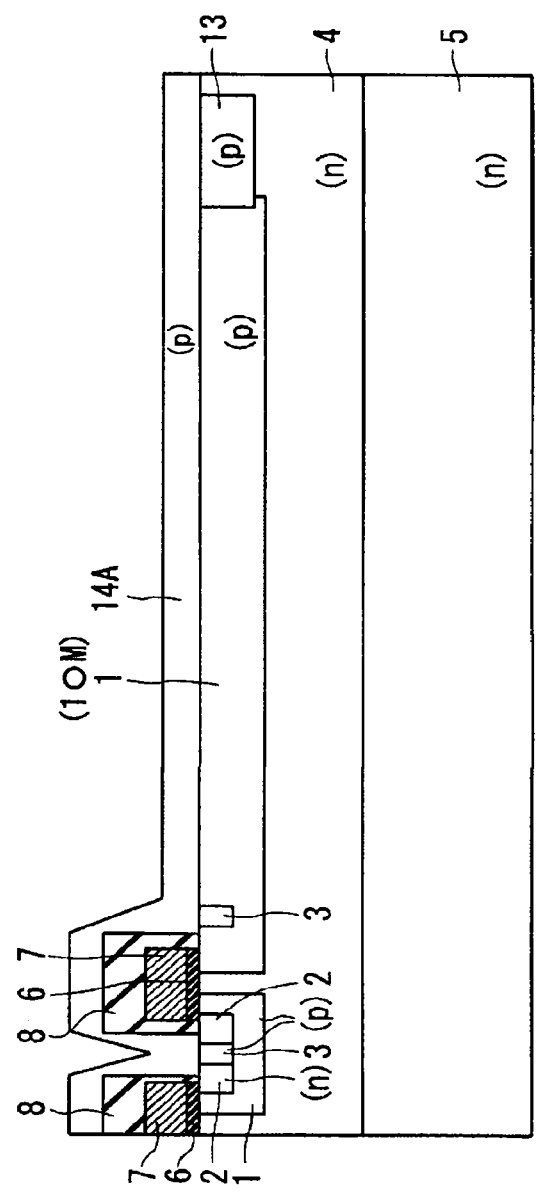
FIG. 7 is a longitudinal sectional view illustrating a manufacturing process of the SiC-MOSFET according to Embodiment 1 of the present invention.

In addition, an insulating film 8A such as a TEOS film is formed (FIG. 5), and the insulating film 8A is subjected to patterning to form a part of the interlayer dielectric film 8 (FIG. 6).

Figure 8:
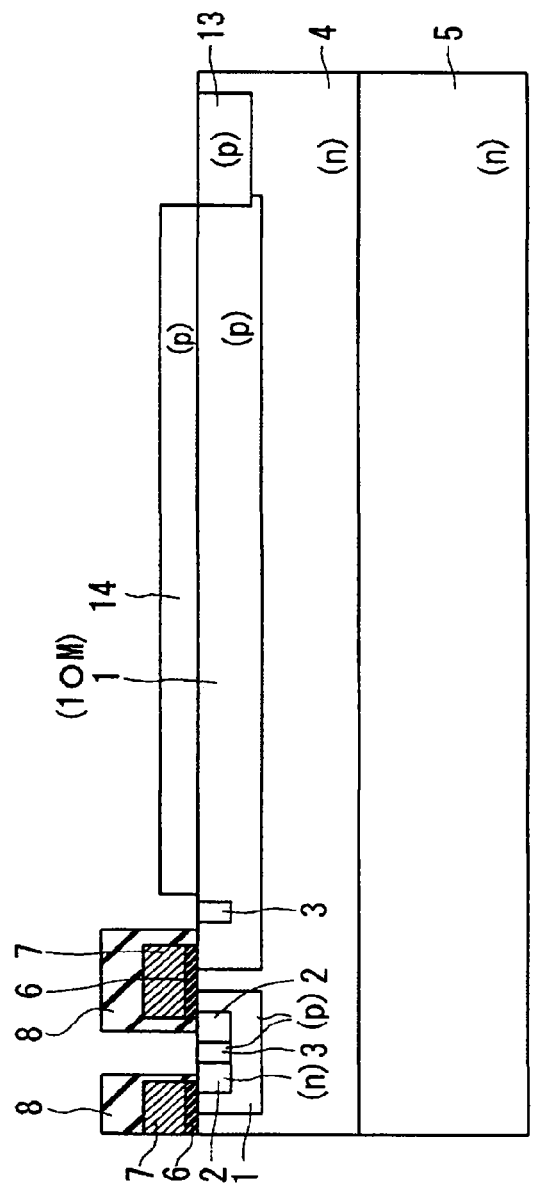
FIG. 8 is a longitudinal sectional view illustrating a manufacturing process of the SiC-MOSFET according to Embodiment 1 of the present invention.
Figure 9:
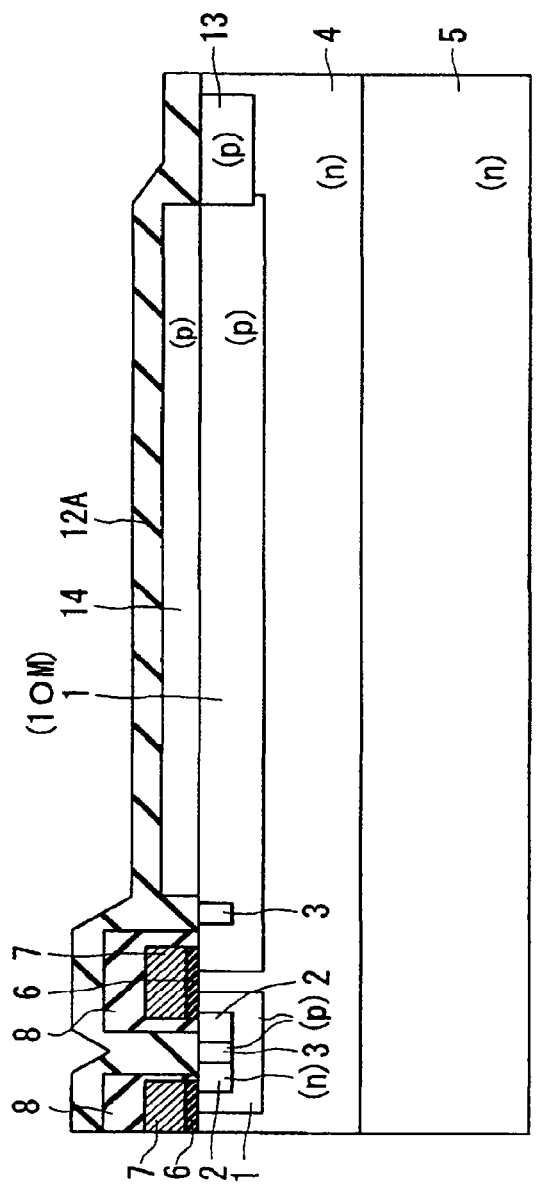
FIG. 9 is a longitudinal sectional view illustrating a manufacturing process of the SiC-MOSFET according to Embodiment 1 of the present invention.

Next, a p-type polysilicon film 14A is formed by the CVD method (FIG. 7), a resist mask (not illustrated) is used to perform patterning in such a way as to cover whole or part of an upper surface of the p-type well layer 1OM that is on the outermost periphery outside the region of the MOSFET cell among the plurality of p-type well layers 1, and the p-type semiconductor layer 14 is formed (FIG. 8). Thereafter, the resist mask is removed.

The p-type semiconductor layer 14 to be formed in this process may be formed of a single crystal, polycrystal, amorphous semiconductor, or mixture of SiC, Si, GaAs, GaP, InP, InAs, ZnS, ZnSe, CdS, SiGe, GaN, AlN, BN, or C (diamond). The film forming method may be a vapor deposition method or a sputtering method.

In this way, the present invention has a feature in which the restriction to the material for the p-type semiconductor layer 14 is small. If the p-type semiconductor layer 14 is formed of SiC containing a p-type impurity, the thermal resistance can be increased.

Figure 10:
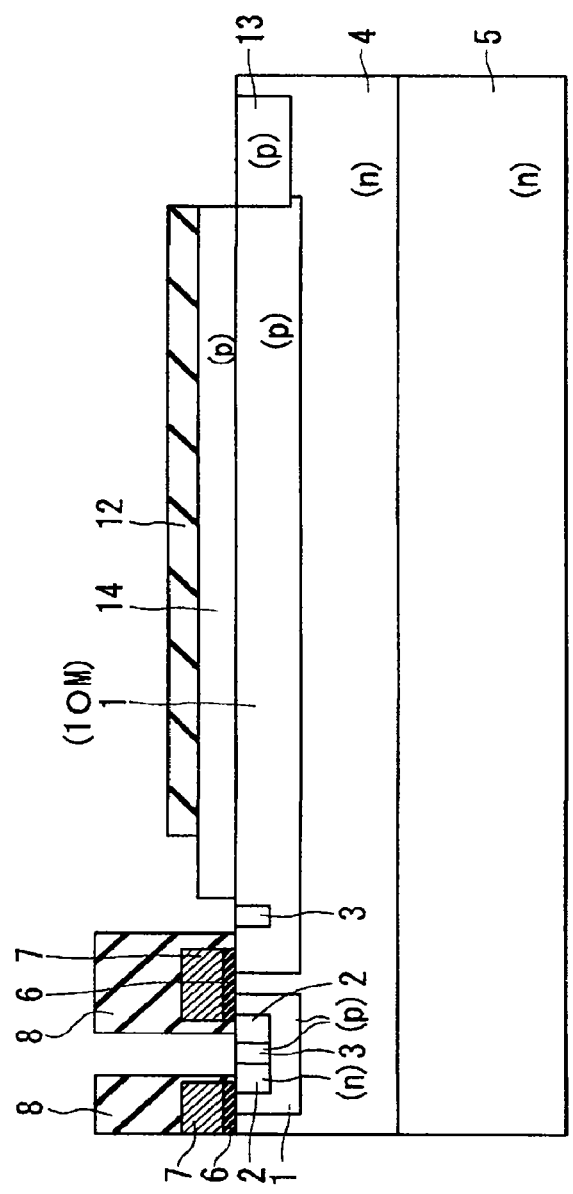
FIG. 10 is a longitudinal sectional view illustrating a manufacturing process of the SiC-MOSFET according to Embodiment 1 of the present invention.
Figure 11:
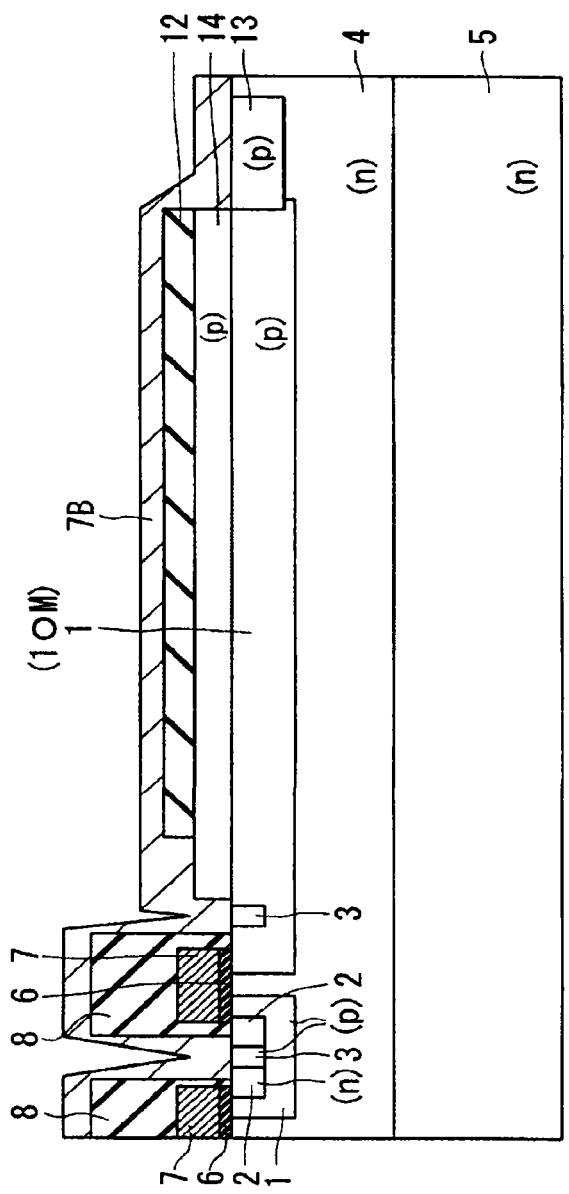
FIG. 11 is a longitudinal sectional view illustrating a manufacturing process of the SiC-MOSFET according to Embodiment 1 of the present invention.

Then, after an oxide film 12A is formed entirely on an exposed surface (FIG. 9), a resist mask (not illustrated) is used to perform patterning on the oxide film 12A, the resist mask is removed, and, as illustrated in FIG. 10, the field oxide film 12 is formed on an entire upper surface of the p-type semiconductor layer 14.

Figure 12:
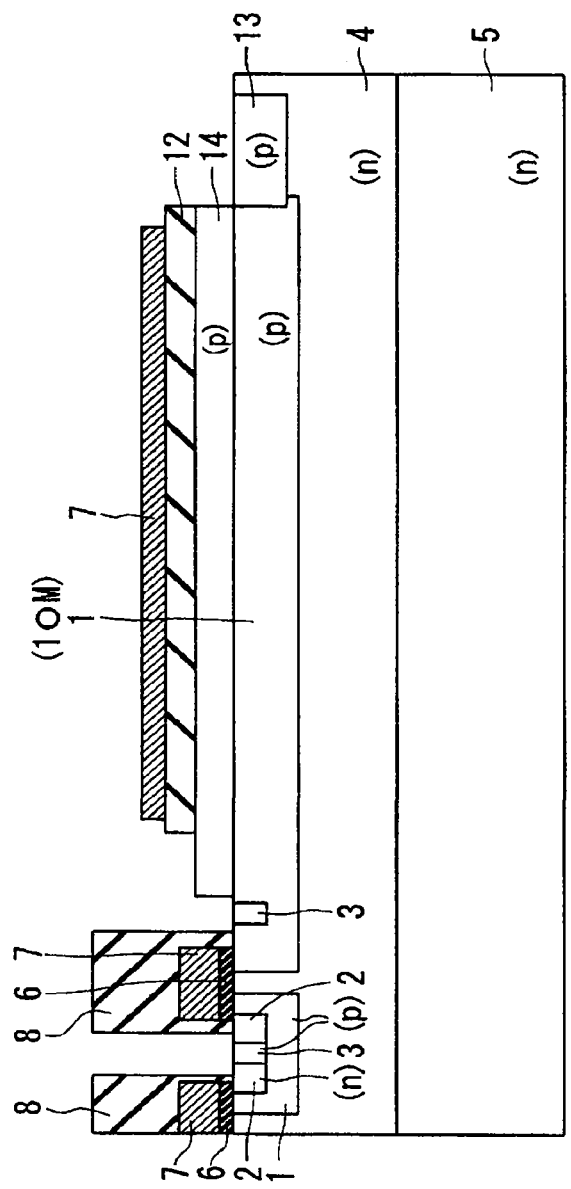
FIG. 12 is a longitudinal sectional view illustrating a manufacturing process of the SiC-MOSFET according to Embodiment 1 of the present invention.
Figure 13:
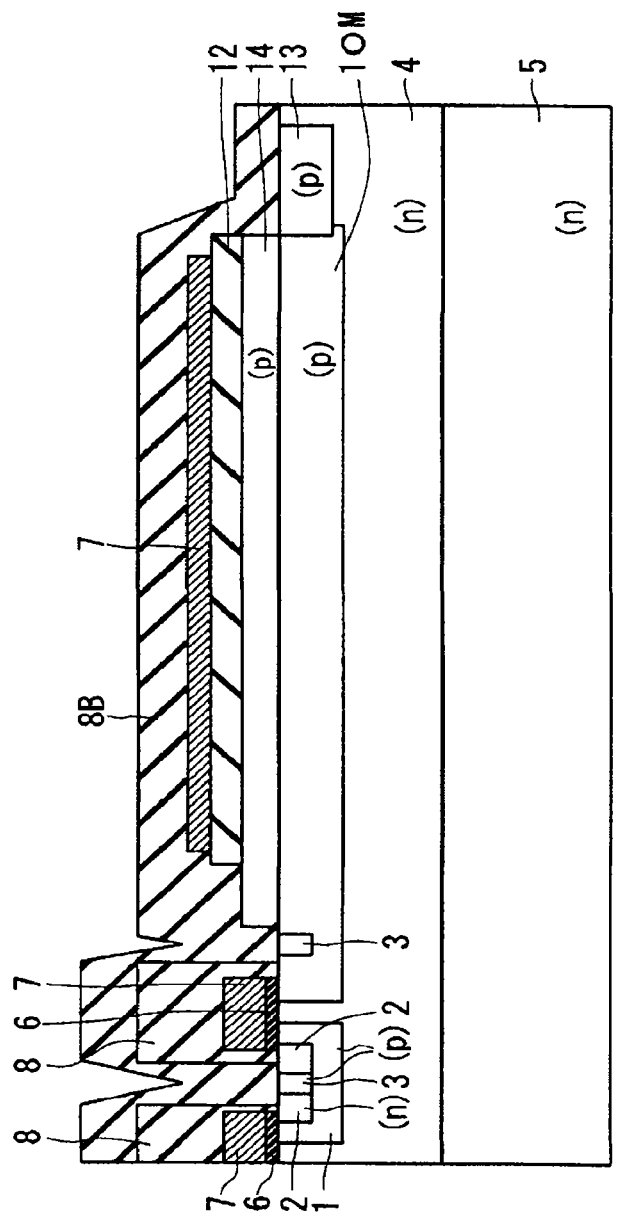
FIG. 13 is a longitudinal sectional view illustrating a manufacturing process of the SiC-MOSFET according to Embodiment 1 of the present invention.

Thereafter, a p-type polysilicon film 7B is entirely deposited by the CVD method (FIG. 11), the p-type polysilicon film 7B is subjected to patterning, and the gate electrode polysilicon layer 7 is formed on the field oxide film 12 (FIG. 12). Although FIG. 12 is illustrated such that each of the gate electrode polysilicon layers 7 is separated from one another, all of the gate electrode polysilicon layers 7 are actually connected to one another like a net.

Figure 14:
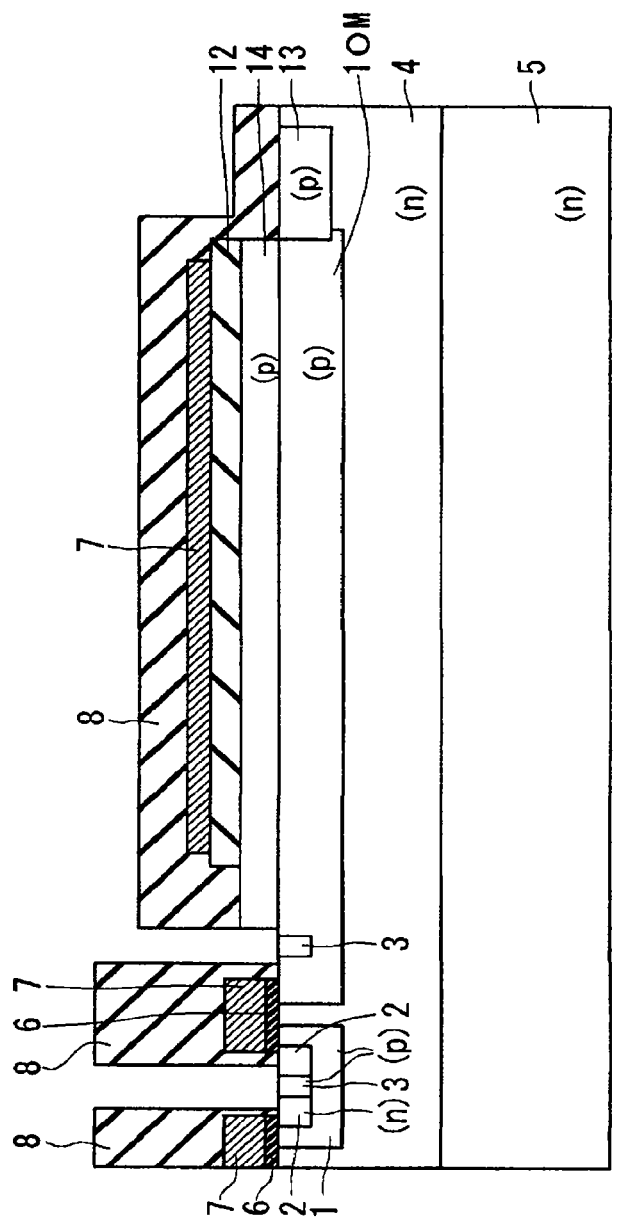
FIG. 14 is a longitudinal sectional view illustrating a manufacturing process of the SiC-MOSFET according to Embodiment 1 of the present invention.

Further, an insulating film 8B such as a TEOS film is formed (FIG. 13), and the insulating film 8B is subjected to patterning to form the interlayer dielectric film 8 (FIG. 14).

Figure 15:
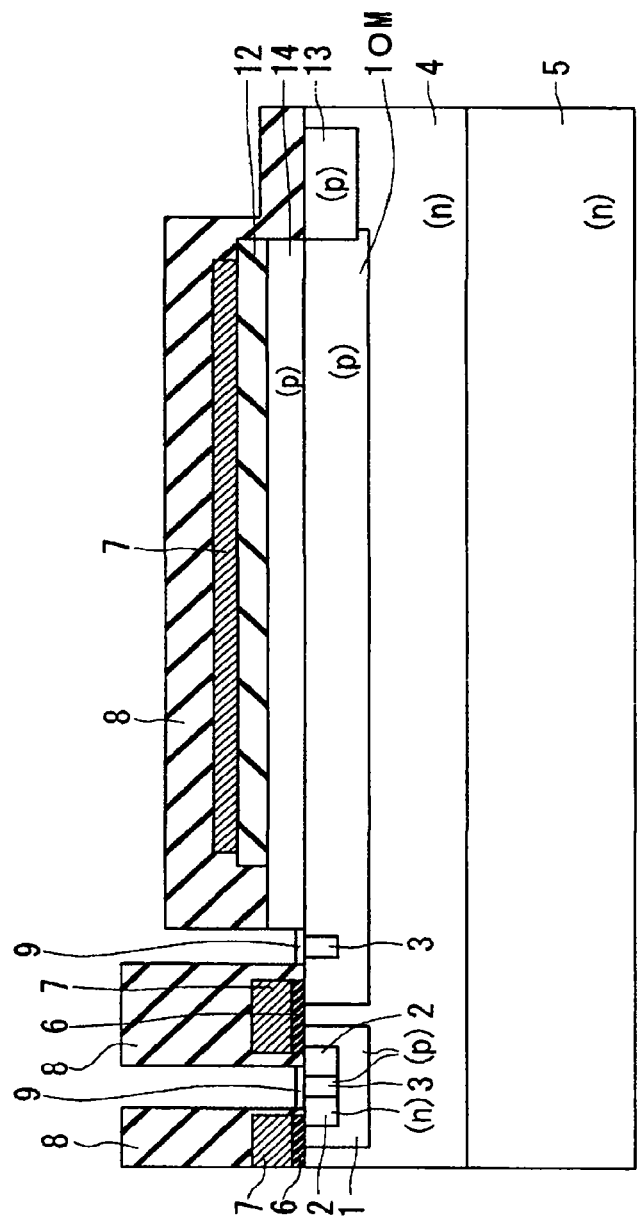
FIG. 15 is a longitudinal sectional view illustrating a manufacturing process of the SiC-MOSFET according to Embodiment 1 of the present invention.
Figure 16:
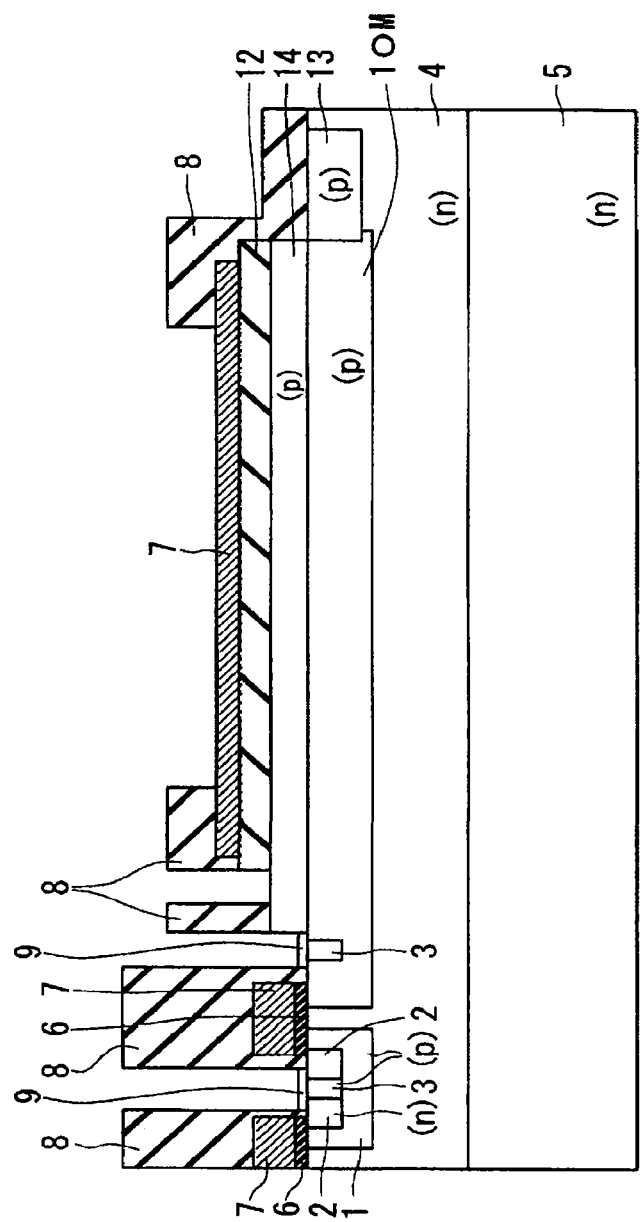
FIG. 16 is a longitudinal sectional view illustrating a manufacturing process of the SiC-MOSFET according to Embodiment 1 of the present invention.

Next, after nickel is deposited and patterning is performed, annealing treatment is performed to silicify nickel, and the well contact layer 3 forms the NiSi layer 9 formed thereon (FIG. 15).

Figure 17:
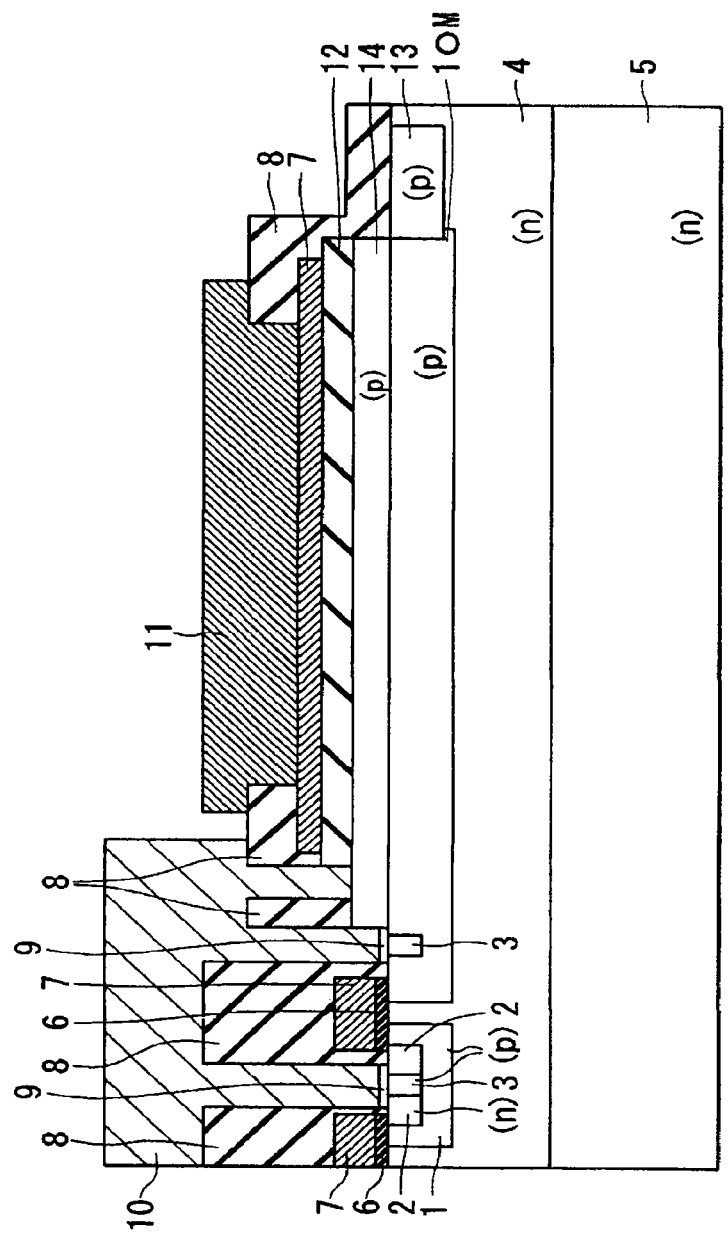
FIG. 17 is a longitudinal sectional view illustrating a manufacturing process of the SiC-MOSFET according to Embodiment 1 of the present invention.

Thereafter, a contact hole to the gate electrode polysilicon layer 7 on the field oxide layer 12 and a contact hole to the p-type semiconductor layer 14 are formed (FIG. 16), aluminum is deposited, and patterning is performed to form the source electrode 10 and the gate electrode pad (gate electrode) 11 (FIG. 17).

Subsequently, the drain electrode 17 illustrated in FIG. 2 is formed on a reverse side of the n-type semiconductor substrate 5.

<Evaluation>

In the SiC-MOSFET produced by a conventional method, when the switching speed is increased, a voltage distribution in the p-type well layer 1 located below the gate pad or below the gate finger becomes large, and the gate insulating film is destroyed. However, in the SiC-MOSFET produced by the manufacturing method according to the present embodiment, the gate insulating film 6 is not destroyed under the same condition, and it is understood that the voltage distribution in the p-type well layer 1 (1OM) which is caused by a voltage drop when a displacement current flows in the p-type well layer 1 (1OM) located below the gate electrode pad 11 is suppressed or reduced due to a presence of the p-type semiconductor layer 14.

Under this condition, an estimation is made, using numerical calculation, on the distribution of the potential difference between the p-type well layer 1 (1OM) and the gate electrode pad (gate electrode) 11 assuming that the fluctuation dV/dt of the drain voltage relative to the time t is 600V/20 nsec. In the SiC-MOSFET produced by the conventional method, the maximum value is 120 V or more, whereas, in the SiC-MOSFET produced by the manufacturing method according to the present embodiment, the maximum value is 60 V or less.

As described above, according to the present embodiment, it is possible to provide a SiC-MOSFET that is capable of increasing the switching speed, and has a long life yet a low loss (saving of energy) without destroying the gate insulating film.

Embodiment 2

Hereinafter, description will be given of a structure and evaluation of an n-type channel SiC-IGBT as an example of a SiC semiconductor device according to the present embodiment.

Figure 18:
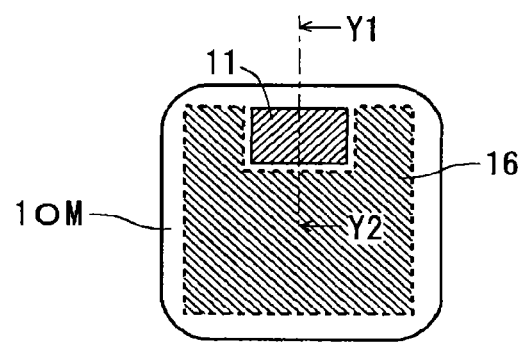
FIG. 18 is a plan view schematically illustrating an upper structure of a SiC-IGBT according to Embodiment 2 of the present invention.
Figure 19:
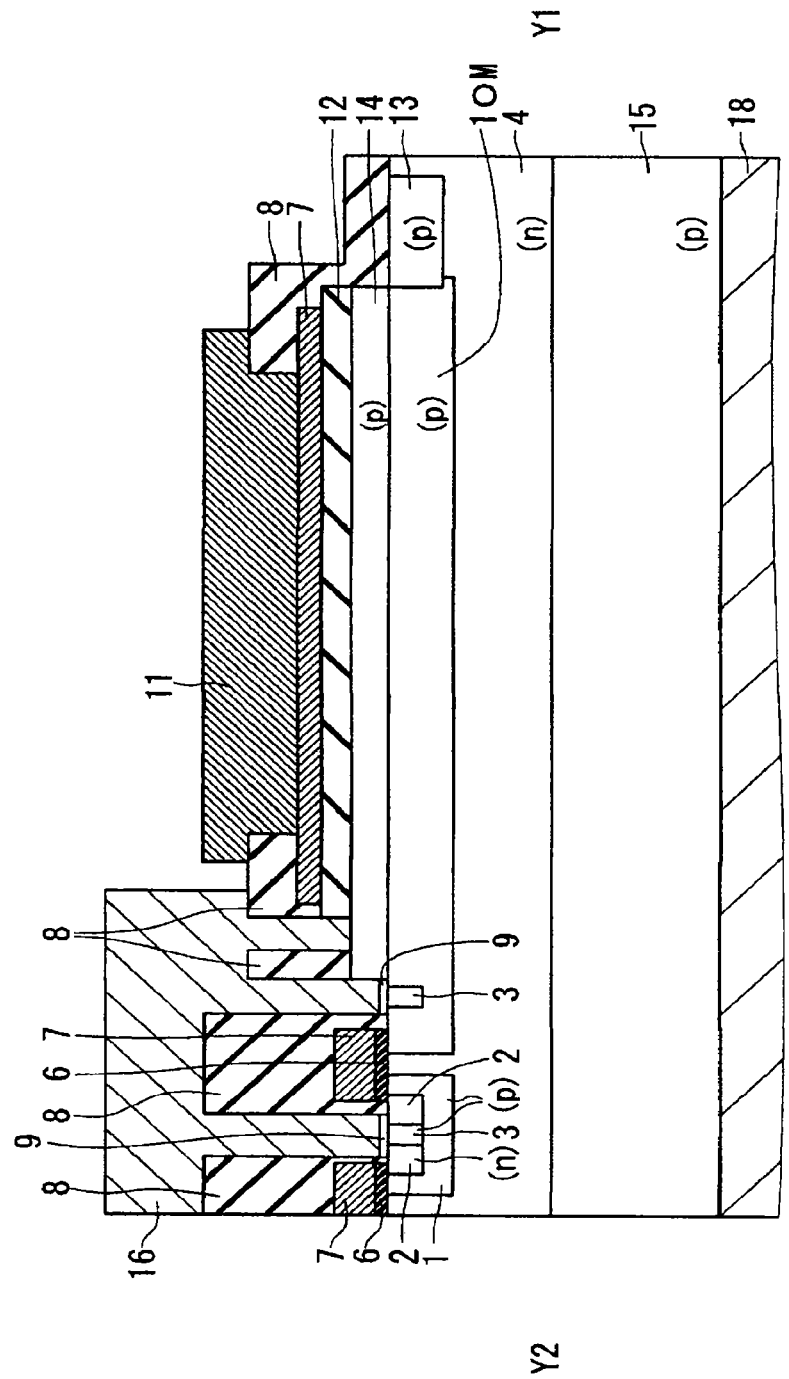
FIG. 19 is a longitudinal sectional view of the SiC-IGBT according to Embodiment 2 of the present invention.

FIG. 18 is a plan view schematically illustrating an upper structure of a SiC-IGBT according to the present embodiment. FIG. 19 is a longitudinal sectional view of the SiC-IGBT illustrated in FIG. 18 taken along line Y1-Y2.

The differences of the structure illustrated in FIG. 19 from the structure illustrated in FIG. 2 are found in a p-type semiconductor substrate 15, an emitter electrode 16, and a collector electrode 18. Other identical reference numerals represent the equivalents. Accordingly, the feature in the structure illustrated in FIG. 19 is also found in the presence of a p-type semiconductor layer 14 that is provided on an upper surface of the p-type well layer 1 (1OM) located on an outermost periphery and having the largest area of the transverse plane among a plurality of p-type well layers 1.

The structure illustrated in FIG. 19 is manufactured in the same process as that of Embodiment 1 except that the p-type semiconductor substrate 15 is used instead of the n-type semiconductor substrate 5. In this case, for example, a p-type 4H-silicon carbide substrate is preferably used as the p-type substrate 15.

<Evaluation>

In the SiC-IGBT produced by a conventional method, when the switching speed is increased, a voltage distribution in the p-type well layer located on the outermost periphery which is caused by a voltage drop becomes 100 V or higher, and a gate insulating film is destroyed. However, in the SiC-IGBT produced according to the present embodiment, the gate insulating film 6 is not destroyed under the same condition, and it is understood that the voltage distribution in the p-type well layer 1OM on the outermost periphery which is caused by a voltage drop is suppressed with a presence of the p-type semiconductor layer 14. Under this condition, an estimation is made, using numerical calculation, on the distribution of the potential difference between the p-type well layer 1OM and the gate electrode pad 11. In the SiC-IGBT produced by the conventional method, the maximum value is 100 V or more, whereas, in the SiC-IGBT produced according to the present embodiment, the maximum value is 50 V or less.

As described above, according to the present embodiment, it is possible to provide a SiC-IGBT that is capable of increasing the switching speed, and has a long life yet a low loss (saving of energy) without destroying the gate insulating film.

<Modification>

In Embodiments 1 and 2 according to the present invention described above, it has been described that the p-type semiconductor layer 14 is entirely or partially provided on the upper surface of the p-type well layer 1 (corresponding to 1OM) located on the outermost periphery. However, as an example of partially providing the p-type semiconductor layer 14, it may be provided in a comb teeth-like shape. Hereinafter, referring to FIGS. 20 to 26, description will be given of an example in which the p-type semiconductor layer 14 is provided in a comb teeth-like shape.

Figure 20:
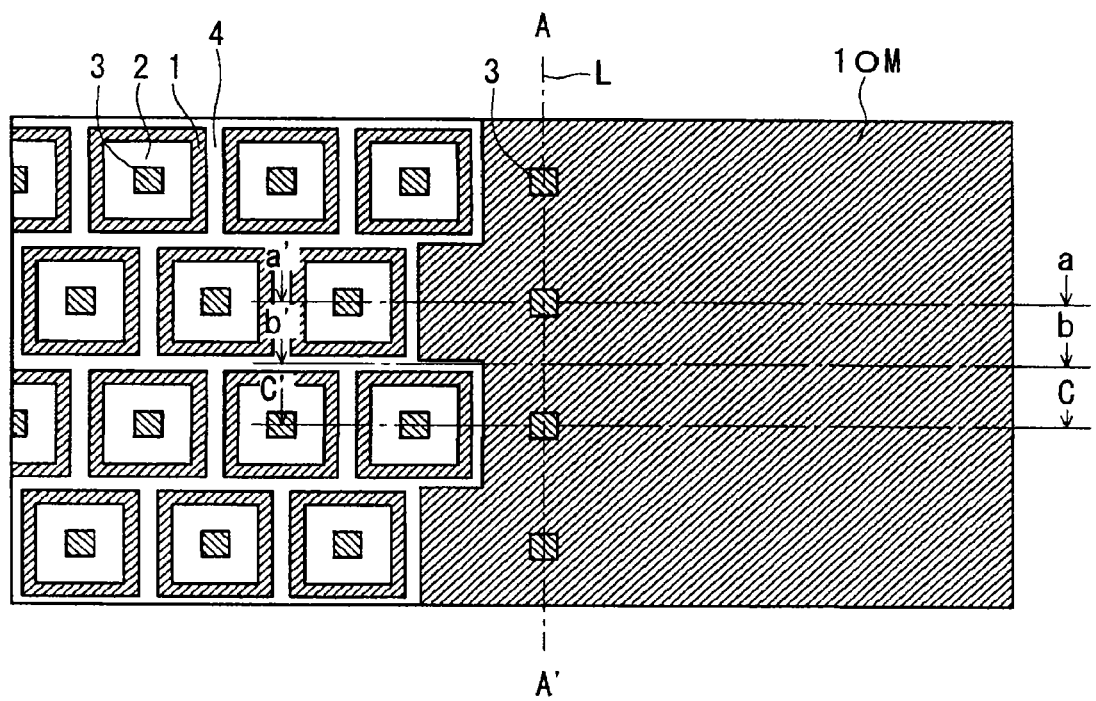
FIG. 20 is a plan view for explaining a structure of a modification of the SiC-MOSFETs according to Embodiments 1 and 2 of the present invention.

FIG. 20 is a partial plan view omitting a structure above the n-type drift layer 4, and illustrates the p-type well layers 1 and 1OM formed in an upper-layer portion of the n-type drift layer 4, the n-type contact layer 2 formed in an upper layer portion of the p-type well layer 1, the p-type well contact layer 3 formed in an upper-layer portion of the p-type well layer 1OM, and the p-type well contact layer 3 formed in an upper-layer portion of the p-type well layer 1. The p-type well layer 1 has a rectangular plan shape, and a plurality of structures in which the n-type contact layer 2 and the p-type well contact layer 3 are formed concentrically in an surface thereof, and arranged spaced apart from one another in a surface of the n-type drift layer 4. The arrangements are made in parallel with one another in a plurality of numbers. The arrangements are referred to as the arrangements of the p-type well contact layers 3 in the following.

Figure 21:
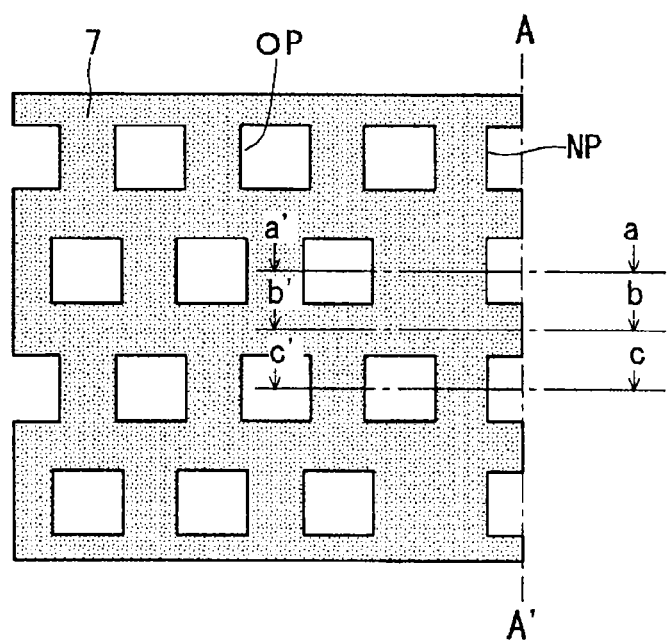
FIG. 21 is a plan view for explaining a structure of a modification of the SiC-MOSFETs according to Embodiments 1 and 2 of the present invention.

FIG. 21 is a partial plan view illustrating the gate electrode polysilicon layer 7 (referred to as "lower polysilicon layer") formed on the n-type drift layer 4, and a rectangular opening OP for exposing the p-type well contact layer 3 is provided in a manner corresponding to a formation position of the p-type well contact layer 3. Here, a notch portion NP1 is provided in a position corresponding to the p-type well contact layer 3 provided in the p-type well layer 1OM.

Figure 22:
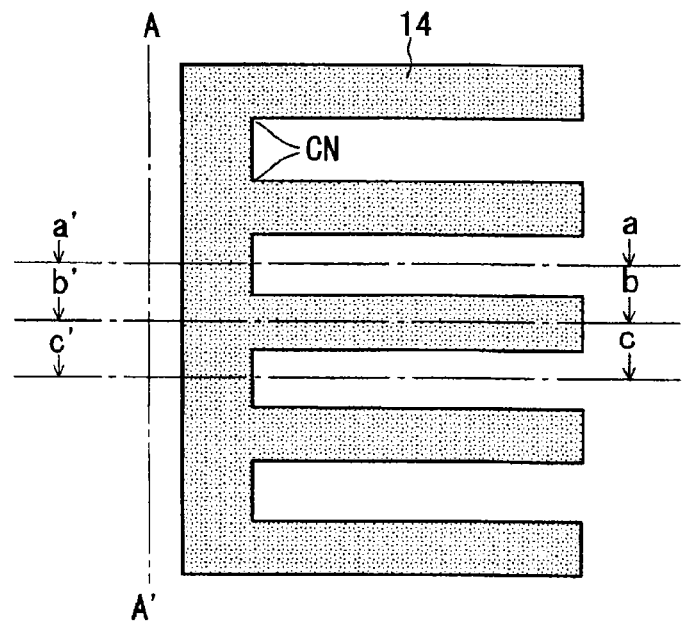
FIG. 22 is a plan view for explaining a structure of a modification of the SiC-MOSFETs according to Embodiments 1 and 2 of the present invention.

FIG. 22 is a partial plan view illustrating the p-type semiconductor layer 14 that is formed in a comb teeth-like shape. The p-type semiconductor layer 14 extends along a direction of the arrangements of the p-type well contact layers 3 but toward a direction opposite thereto and makes a form of a plurality of comb teeth. The p-type semiconductor layer 14 extends along a direction in which the comb teeth are arranged in such a manner as to connect the arrangements of the comb teeth by one ends of the comb teeth.

Figure 23:
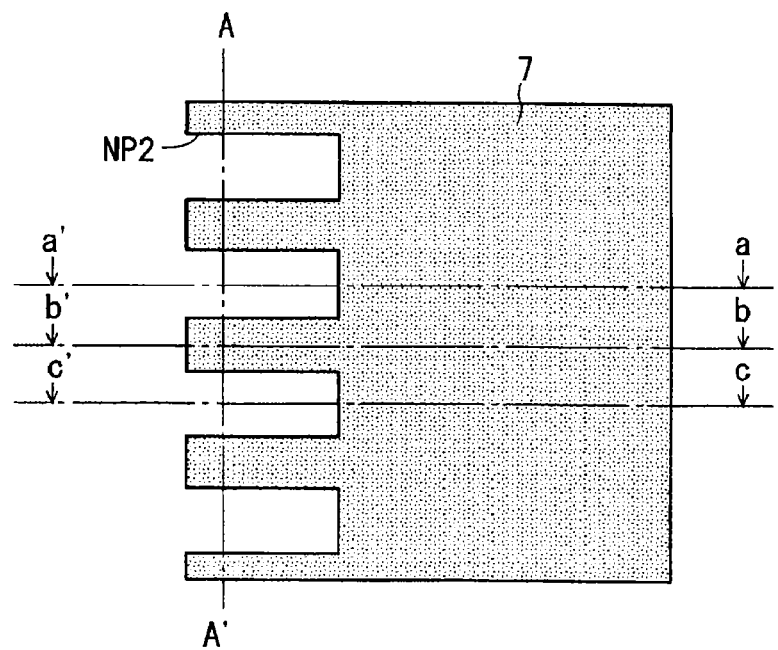
FIG. 23 is a plan view for explaining a structure of a modification of the SiC-MOSFETs according to Embodiments 1 and 2 of the present invention.

FIG. 23 is a partial plan view illustrating the gate electrode polysilicon layer 7 (referred to as "upper polysilicon layer") formed on the interlayer dielectric film 8. A notch portion NP2 is provided in a position corresponding to the p-type well contact layer 3 provided in the p-type well layer 1OM.

Figure 24:
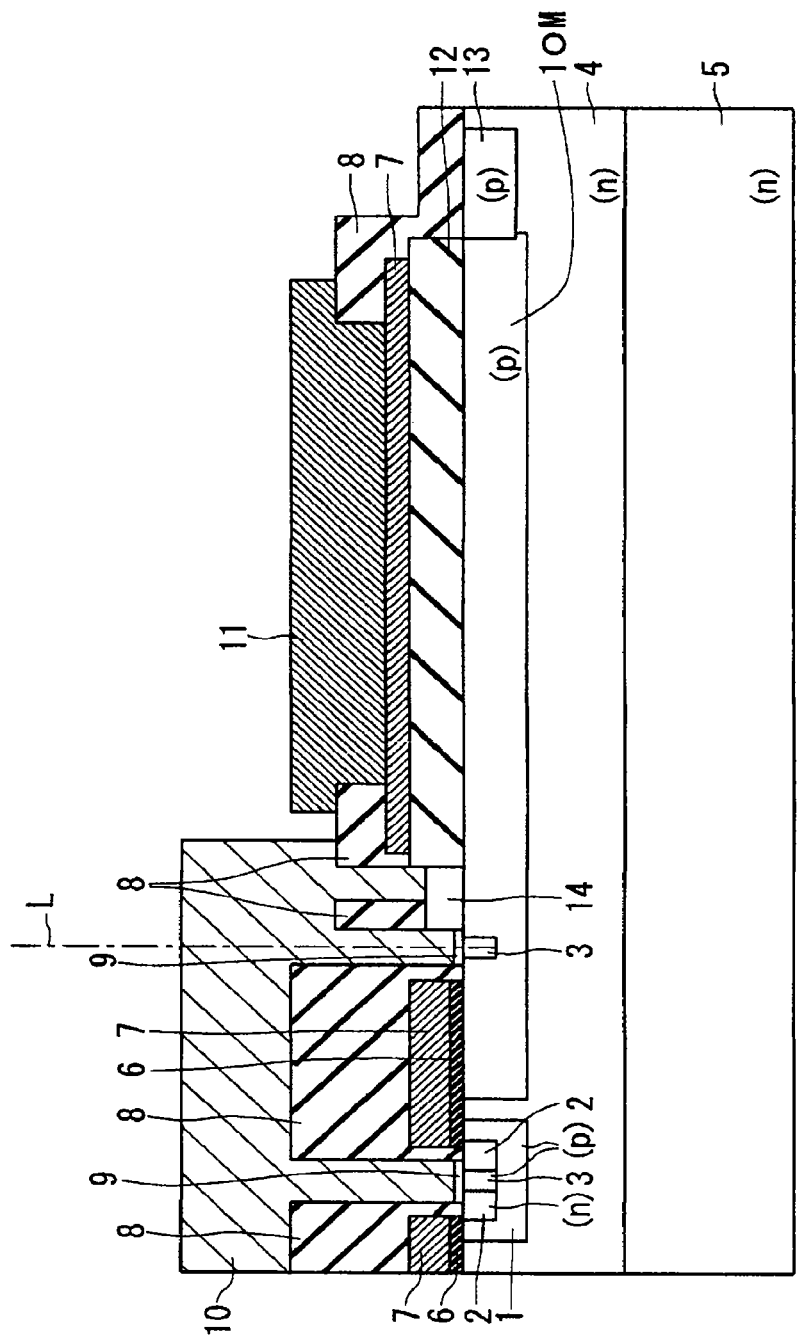
FIG. 24 is a plan view for explaining a structure of a modification of the SiC-MOSFETs according to Embodiments 1 and 2 of the present invention.
Figure 25:
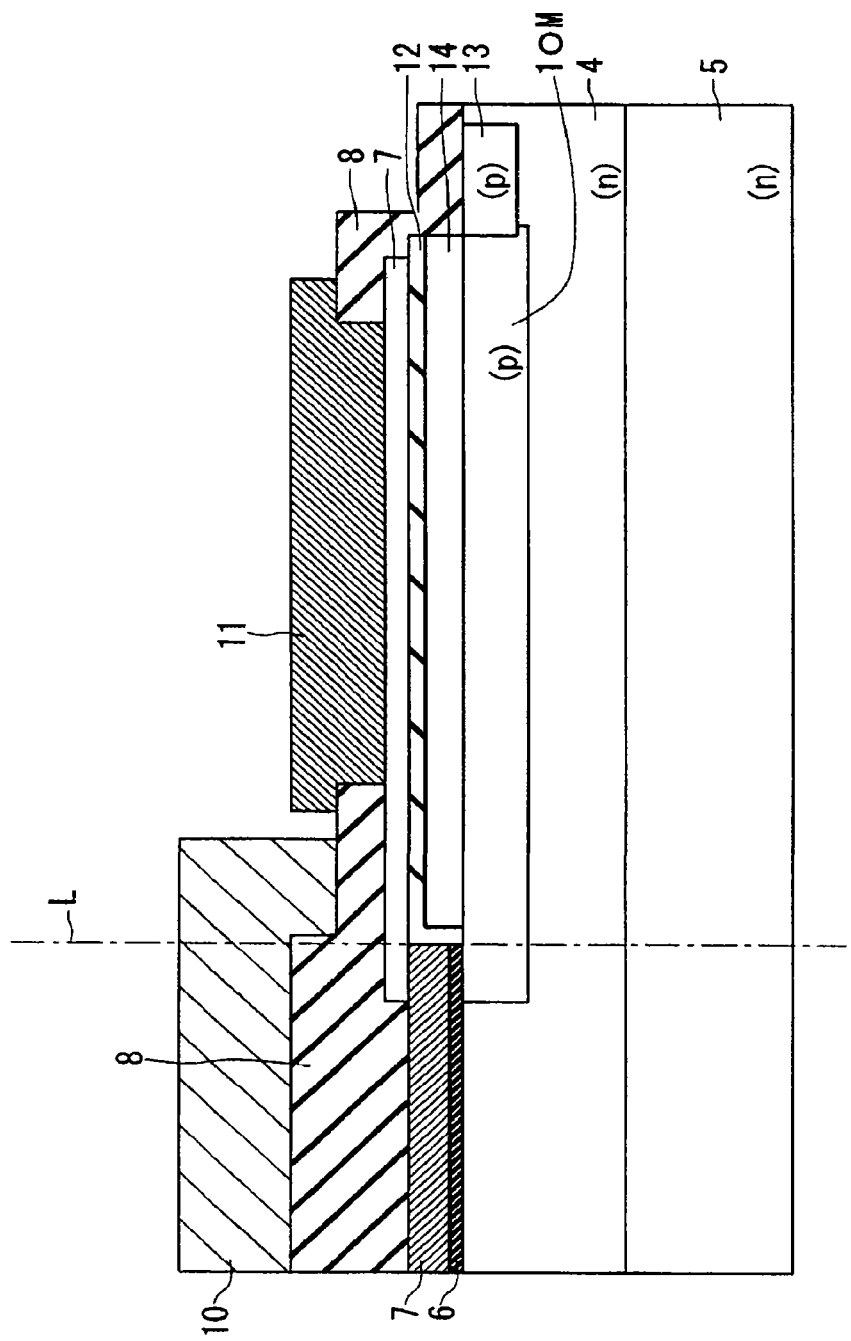
FIG. 25 is a plan view for explaining a structure of a modification of the SiC-MOSFETs according to Embodiments 1 and 2 of the present invention.
Figure 26:
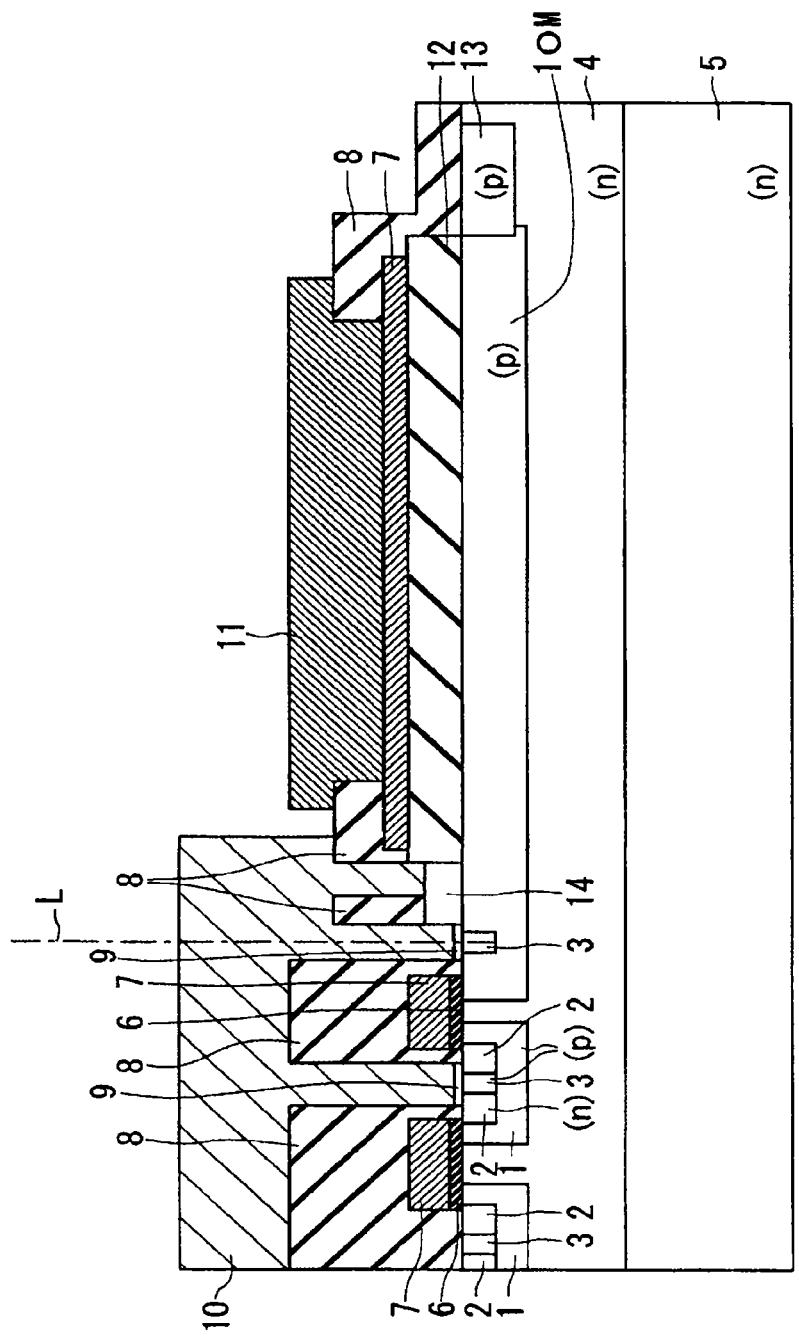
FIG. 26 is a plan view for explaining a structure of a modification of the SiC-MOSFETs according to Embodiments 1 and 2 of the present invention.

FIGS. 24, 25, and 26 illustrate cross sectional views taken along lines a-a', b-b', and c-c' illustrated in FIGS. 20 to 23, respectively. In addition, the position of the line A-A' illustrated in FIGS. 20 to 23 corresponds to the position of a line L illustrated in FIGS. 24, 25, and 26.

By forming the p-type semiconductor layer 14 in a comb teeth-like shape, a region in which the electric field concentrates is formed in a bonded surface between the p-type well layer 1OM and the p-type semiconductor layer 14. That is, since corners CN are present in a portion corresponding to a portion between the comb teeth in FIG. 22, the region in which the electric field concentrates is formed in the bonded surface near the corners CN. As a result, the injection of holes from the p-type semiconductor layer 14 into the p-type well layer 1OM is facilitated.

Embodiment 3

Hereinafter, description will be given of a structure, a manufacturing method, and evaluation of an n-type channel SiC-MOSFET as an example of a SiC semiconductor device according to the present embodiment.

Figure 27:
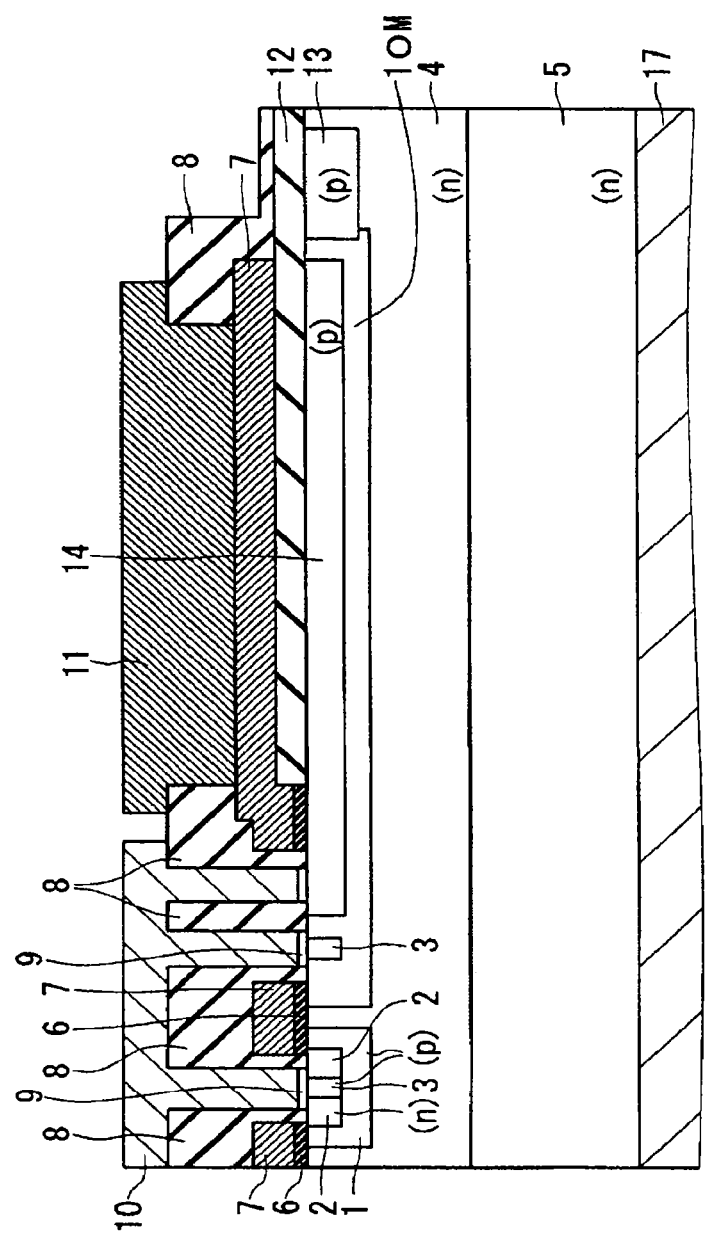
FIG. 27 is a longitudinal sectional view of a SiC-MOSFET according to Embodiment 3 of the present invention.
Figure 28:
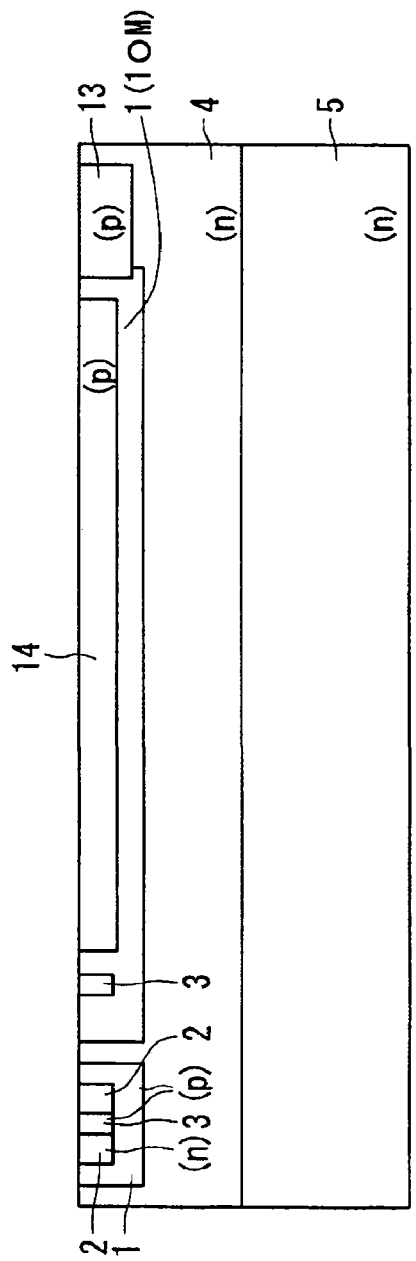
FIG. 28 is a longitudinal sectional view illustrating a manufacturing process of the SiC-MOSFET according to Embodiment 3 of the present invention.

FIG. 27 is a view illustrating a longitudinal sectional structure of a SiC-MOSFET illustrated in FIG. 1 taken along line Y1-Y2. The structure illustrated in FIG. 27 is an example in which the p-type semiconductor layer 14 is formed in a part of the p-type well layer 1OM located on the outermost periphery outside the region of the MOSFET cell.

The n-type channel SiC-MOSFET having a structure illustrated in FIG. 27 is different from the n-type channel SiC-MOSFET of Embodiment 1 illustrated in FIG. 2 in that the p-type semiconductor layer 14 is not formed on the p-type well layer 1OM but is formed in an upper layer of the p-type well layer 1OM. Therefore, the same process as used for the n-type channel SiC-MOSFET described in Embodiment 1 is used up to forming the p-type well contact layer 3. Hereinafter, a manufacturing method of the SiC-MOSFET according to the present embodiment will be described referring to longitudinal sectional views of FIGS. 28 to 34 which sequentially illustrate each manufacturing process.

After the p-type well contact layer 3 is formed in the plurality of p-type well layers 1, a resist (not illustrated) is used to mask, entirely or partially, an upper surface of the p-type well layer 1OM located on the outermost periphery outside the region of the MOSFET cell among the plurality of p-type well layers 1, a p-type impurity is ion-implanted to form the p-type semiconductor layer 14, and thereafter, the resist is removed.

It is preferable that the concentration of the impurity to be ion-implanted be in a range not less than $1 \times 10^{20}$ cm$^{-3}$ and not more than $1 \times 10^{21}$ cm$^{-3}$, and the thickness of the p-type well contact layer 3 be in a range not less than 0.3 μm and not more than 0.8 μm. For example, boron (B) or aluminum (Al) is named as the p-type impurity.

The p-type semiconductor layer 14 may be formed simultaneously with the formation of the p-type well contact layer 3.

Next, activation of the n-type and p-type impurities which are ion-implanted will be performed. This is a process in which a wafer is subjected to annealing treatment under a high temperature by a heat treatment device, and the implanted ions are electrically activated.

It is also possible to use an epitaxial crystal growth method to deposit n-type SiC, perform patterning by using a resist (not illustrated) as a mask, and form an n-type channel epitaxial layer. It is preferable that the impurity to be doped in the n-type channel epitaxial layer be nitrogen, the concentration of nitrogen be in a range not less than $1 \times 10^{16}$ cm$^{-3}$ and not more than $1 \times 10^{17}$ cm$^{-3}$, and the thickness of the n-type channel epitaxial layer be in a range not less than 0.3 μm and not more than 0.6 μm. Here, phosphorus may be doped instead of nitrogen.

Figure 29:
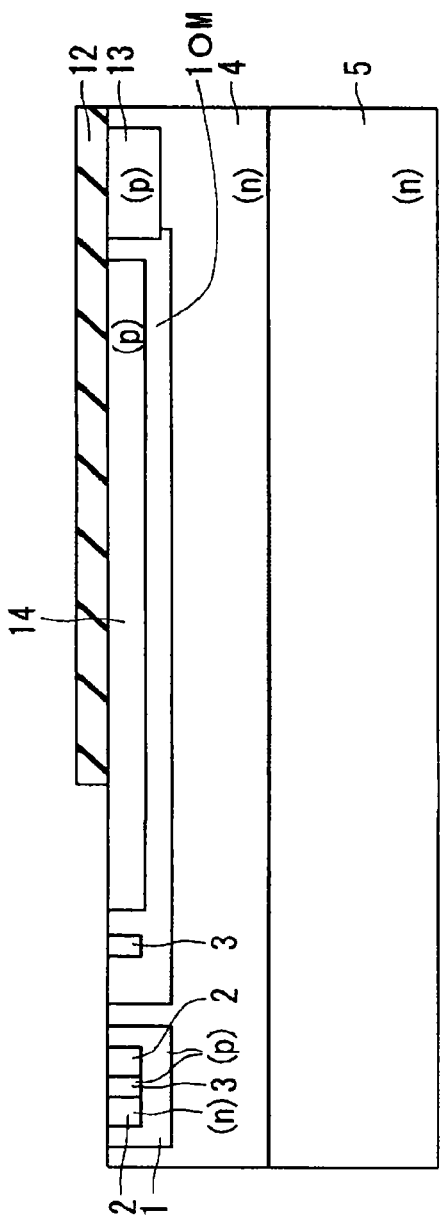
FIG. 29 is a longitudinal sectional view illustrating a manufacturing process of the SiC-MOSFET according to Embodiment 3 of the present invention.

After the annealing treatment, an insulating film such as a TEOS film is formed, and the insulating film is subjected to patterning so that a field oxide film 12 that extends from the p-type well layer 1OM over the JTE layer 13 and extends further toward an outer periphery is formed, as illustrated in FIG. 29.

Figure 30:
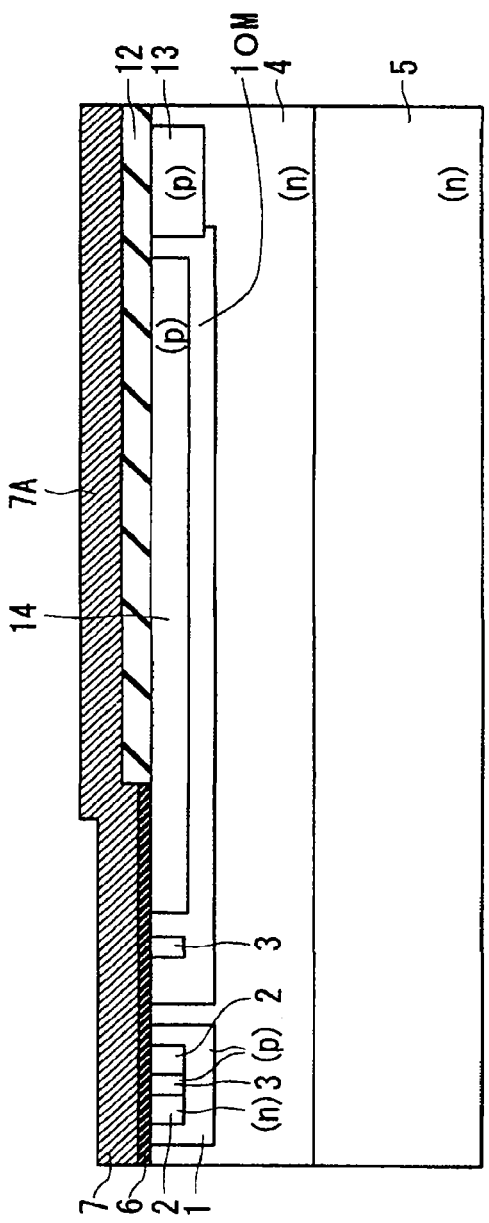
FIG. 30 is a longitudinal sectional view illustrating a manufacturing process of the SiC-MOSFET according to Embodiment 3 of the present invention.

Thereafter, as illustrated in FIG. 30, an upper surface of the n-type drift layer 4 is oxidized by thermal oxidation, so that an insulating film 6 such as a SiO$_2$ film is formed on an entire wafer. Thereafter, a p-type polysilicon film 7A is deposited on the entire wafer by the CVD method.

Figure 31:
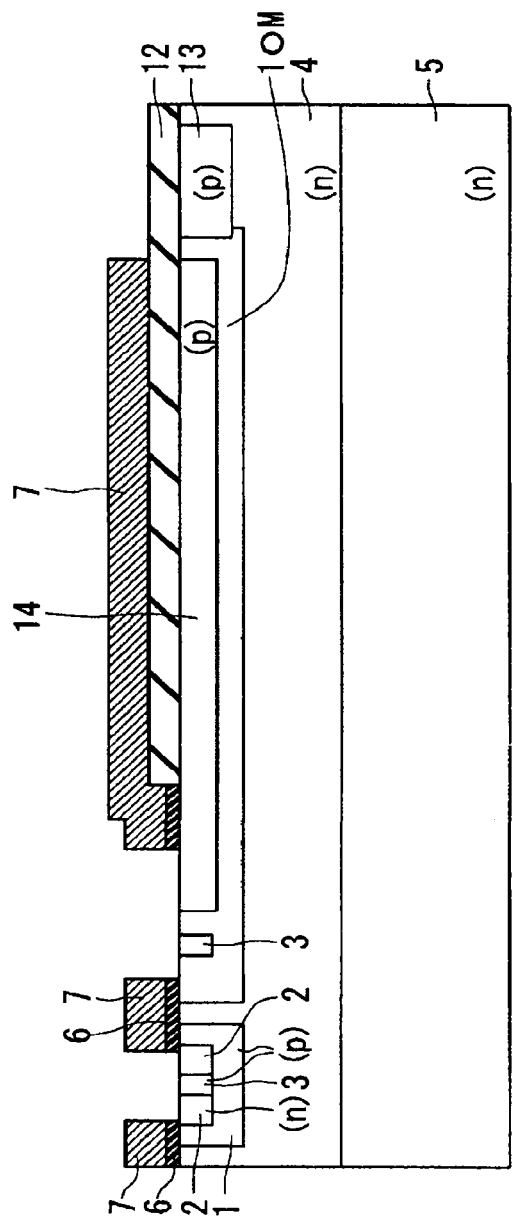
FIG. 31 is a longitudinal sectional view illustrating a manufacturing process of the SiC-MOSFET according to Embodiment 3 of the present invention.

After the p-type polysilicon film 7A and the insulating film 6 are subjected to patterning, as illustrated in FIG. 31, the gate insulating film 6 and the gate electrode polysilicon layer 7 provided thereon are formed in the region of the MOSFET cell. In this patterning, the p-type polysilicon film 7A extending over the JTE layer 13 further toward the periphery is also removed.

Figure 32:
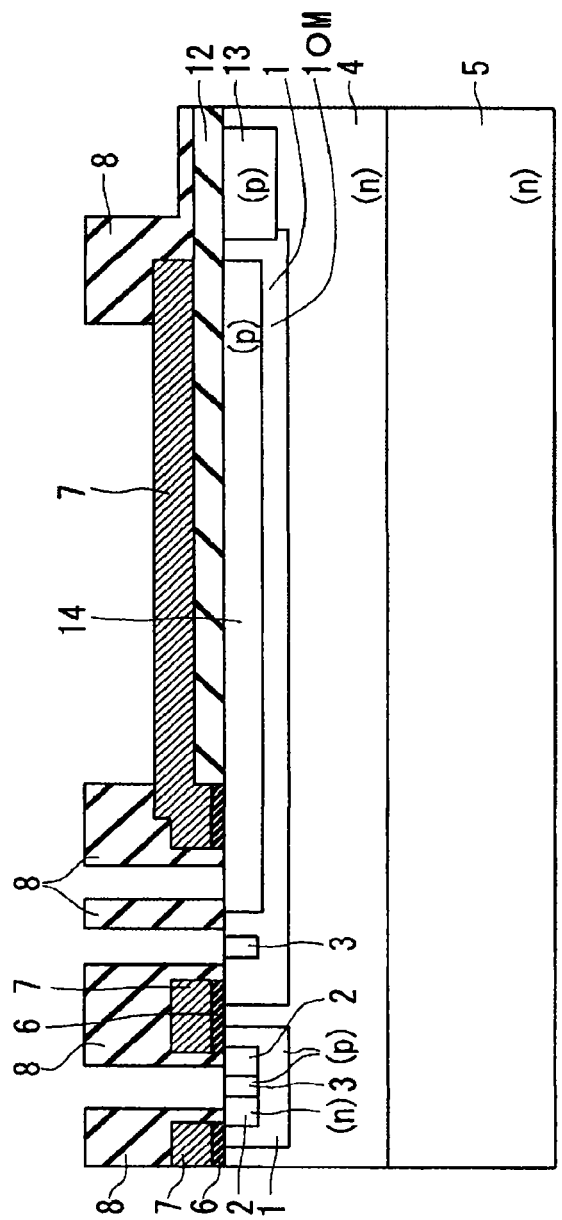
FIG. 32 is a longitudinal sectional view illustrating a manufacturing process of the SiC-MOSFET according to Embodiment 3 of the present invention.

Further, an insulating film such as a TEOS film is formed, and the insulating film is subjected to patterning so that an interlayer dielectric film 8 illustrated in FIG. 32 is formed. The patterning is performed so that the interlayer dielectric film 8 covers the gate insulating film 6 and the gate electrode polysilicon layer 7, openings are each formed above the p-type well contact layer 3, partially above the p-type semiconductor layer 14, and above the gate electrode polysilicon layer 7 which is located above the p-type semiconductor layer 14.

Figure 33:
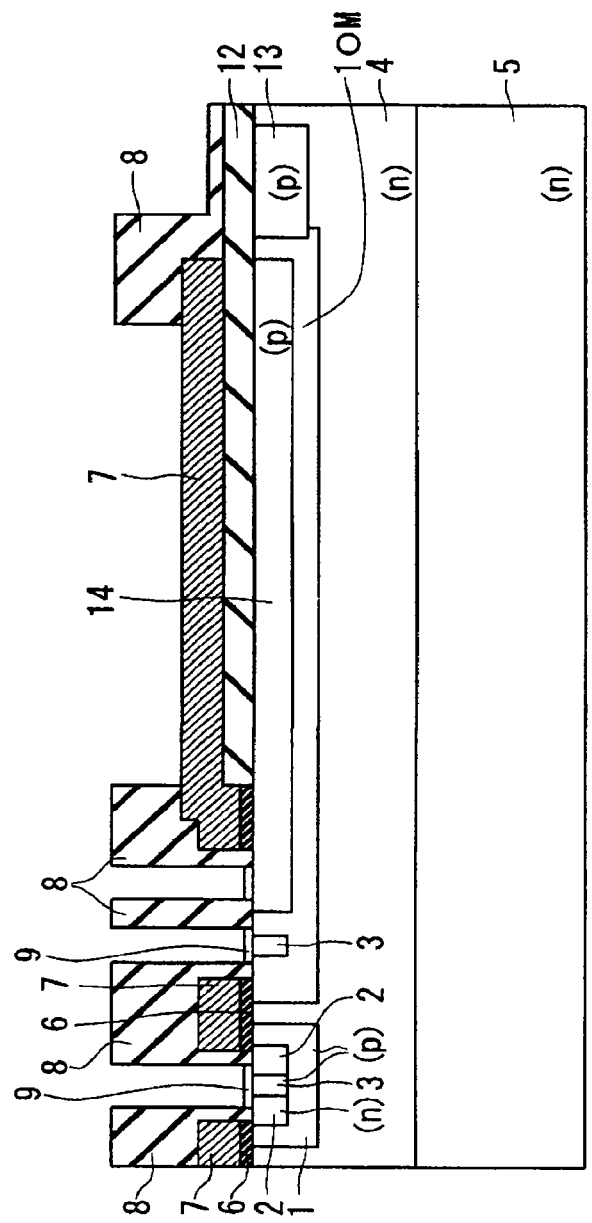
FIG. 33 is a longitudinal sectional view illustrating a manufacturing process of the SiC-MOSFET according to Embodiment 3 of the present invention.

Next, after a nickel layer is deposited on an entire wafer, patterning is performed so that the nickel layer remains on the p-type well contact layer 3 and the p-type semiconductor layer 14 that exposes in the bottom of the opening. Then, annealing treatment is performed to silicify the nickel layer, and, as illustrated in FIG. 33, the NiSi layer 9 is formed on the p-type well contact layer 3 and the p-type semiconductor layer 14 that exposes in the bottom of the opening.

Subsequently, after an aluminum layer is deposited on an entire wafer, patterning is performed to form the source electrode 10, the gate electrode pad (gate electrode) 11, and by further forming the drain electrode 17 on a reverse side of the n-type semiconductor substrate 5, the n-type channel SiC-MOSFET illustrated in FIG. 27 can be obtained.

<Evaluation>

In the SiC-MOSFET produced by a conventional method, when the switching speed is increased, a voltage distribution in the p-type well layer 1 located below the gate pad or below the gate finger becomes large, and a gate insulating film is destroyed. However, in the SiC-MOSFET produced by the manufacturing method according to the present embodiment, the gate insulating film 6 is not destroyed under the same condition, and it is understood that the voltage distribution in the p-type well layer 1 (1OM) which is caused by a voltage drop when a displacement current flows in the p-type well layer 1 (1OM) located below the gate electrode pad 11 is suppressed or reduced due to the presence of the p-type semiconductor layer 14.

Under this condition, an estimation is made, using numerical calculation, on the distribution of the potential difference between the p-type well layer 1 (1OM) and the gate electrode pad (gate electrode) 11 assuming that the fluctuation dV/dt of the drain voltage relative to the time t is 600 V/20 nsec. In the SiC-MOSFET produced by the conventional method, the maximum value is 120 V or more, whereas, in the SiC-MOSFET produced by the manufacturing method according to the present embodiment, the maximum value is 55 V or less.

As described above, according to the present embodiment, it is possible to provide a SiC-MOSFET that is capable of increasing the switching speed, and has a long life yet a low loss (saving of energy) without destroying the gate insulating film.

(Supplement)

While the embodiments of the present invention have been disclosed and described in detail, the foregoing descriptions exemplify aspects in which the present invention can be applied and the present invention is not limited thereto. That is, various modifications and variations can be devised for the described aspects without departing from the scope of the present invention.

<Modification 1>

According to the n-type channel SiC-MOSFET of Embodiment 3 described above, since the p-type semiconductor layer 14 is formed in an upper-layer portion of the p-type well layer 1OM, the p-type well contact layer 3 similarly formed in upper-layer portion of the p-type well layer 1OM and the p-type semiconductor layer 14 may be integrated.

Figure 34:
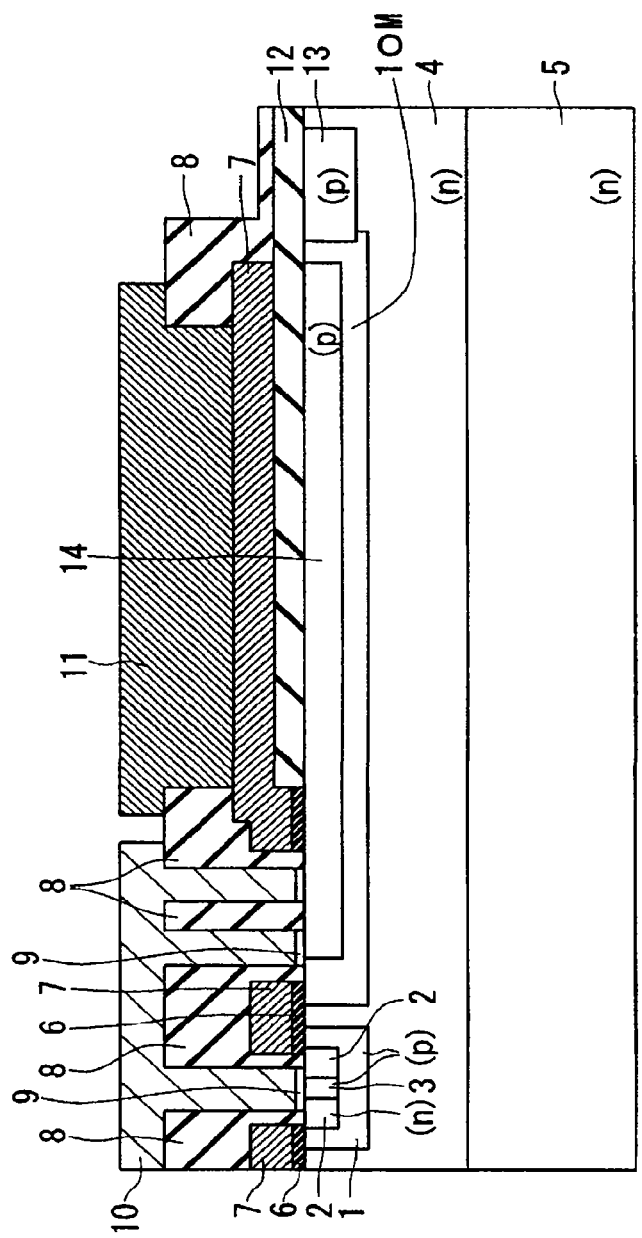
FIG. 34 is a longitudinal sectional view for explaining a structure of Modification 1 of the SiC-MOSFET according to Embodiment 3 of the present invention.

Such a structure is illustrated in FIG. 34. As illustrated in FIG. 34, the p-type semiconductor layer 14 extends to a vicinity of the region of the MOSFET cell, and an end edge thereof is connected to the source electrode 10.

<Modification 2>

It has been described that, in the n-type channel SiC-MOSFET according to Embodiment 3 described above, the p-type semiconductor layer 14 is entirely or partially provided on the upper surface of the p-type well layer 1 (corresponding to 1OM) located on the outermost periphery. However, as an example of partially providing, it may be provided in a comb teeth-like shape. Hereinafter, referring to FIGS. 35 to 39, description will be given of an example in which the p-type semiconductor layer 14 is provided in a comb teeth-like shape.

Figure 35:
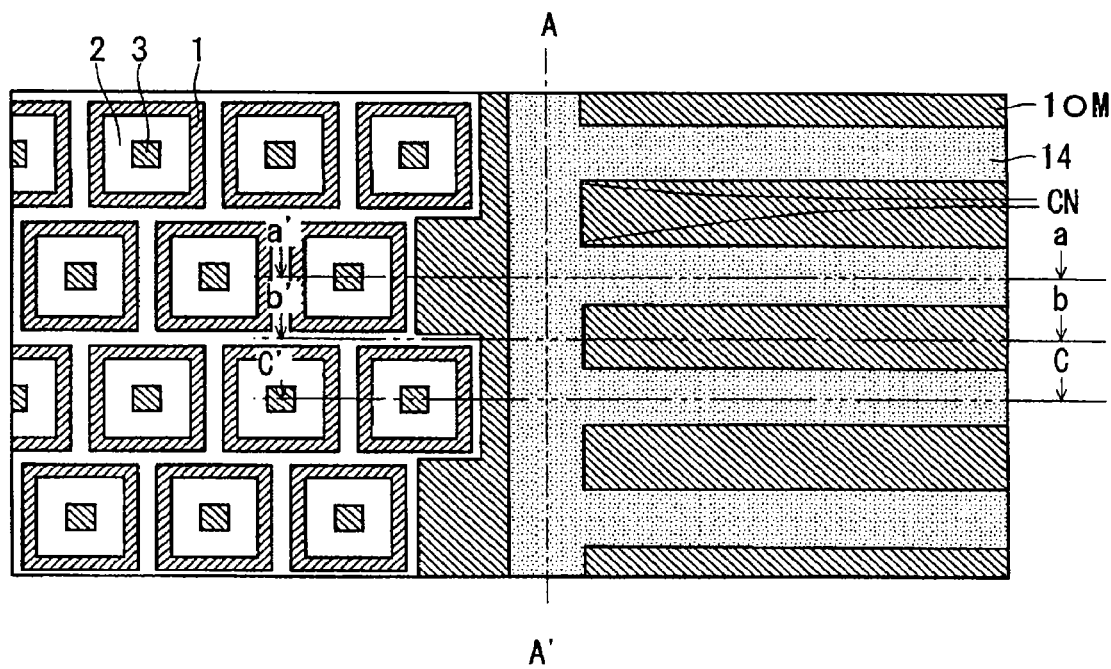
FIG. 35 is a plan view for explaining a structure of Modification 2 of the SiC-MOSFET according to Embodiment 3 of the present invention.

FIG. 35 is a partial plan view of the case where a structure above the n-type drift layer 4 is omitted, and illustrates the p-type well layer 1 and 1OM formed in an upper-layer portion of the n-type drift layer 4, the n-type contact layer 2 formed in an upper layer portion of the p-type well layer 1, the p-type well contact layer 3 formed in an upper-layer portion of the p-type well layer 1OM, and the p-type well contact layer 3 formed in an upper-layer portion of the p-type well layer 1. The p-type well layer 1 has a rectangular plan shape, and the structures in which the n-type contact layer 2 and the p-type well contact layer 3 are formed concentrically in an surface thereof are arranged spaced apart from one another in an surface of the n-type drift layer 4. The arrangements are formed in parallel with one another in a plurality of numbers. Hereinafter, the arrangements are referred to as the arrangements of the p-type well contact layers 3. The p-type semiconductor layer 14 formed in a comb teeth-like shape extends along a direction of the arrangements of the p-type well contact layers 3 but toward a direction opposite thereto and forms a plurality of comb teeth. The p-type semiconductor layer 14 extends along a direction in which the comb teeth are arranged in a manner as to connect the arrangements of the comb teeth by one ends of the comb teeth.

Figure 36:
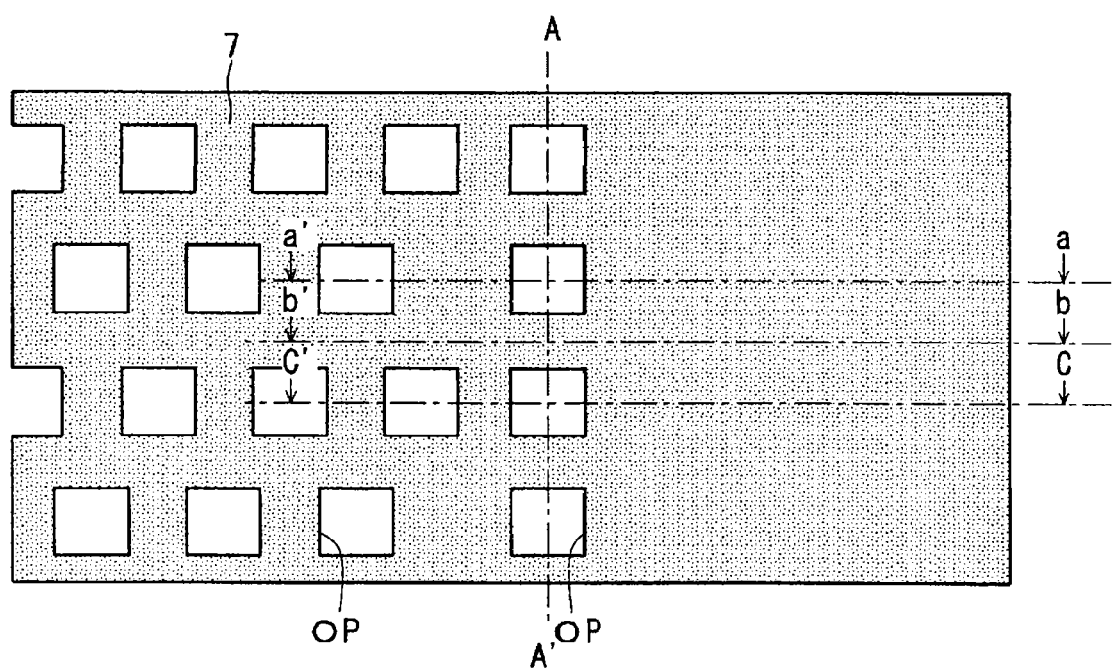
FIG. 36 is a plan view for explaining a structure of Modification 2 of the SiC-MOSFET according to Embodiment 3 of the present invention.

FIG. 36 is a partial plan view illustrating the gate electrode polysilicon layer 7, and a rectangular opening OP for exposing the p-type well contact layer 3 is formed in a manner corresponding to a formation position of the p-type well contact layer 3. Also, a plurality of similar openings OP are provided spaced apart from one another in a position corresponding to the p-type well contact layer 3 provided in the p-type well layer 1OM.

Figure 37:
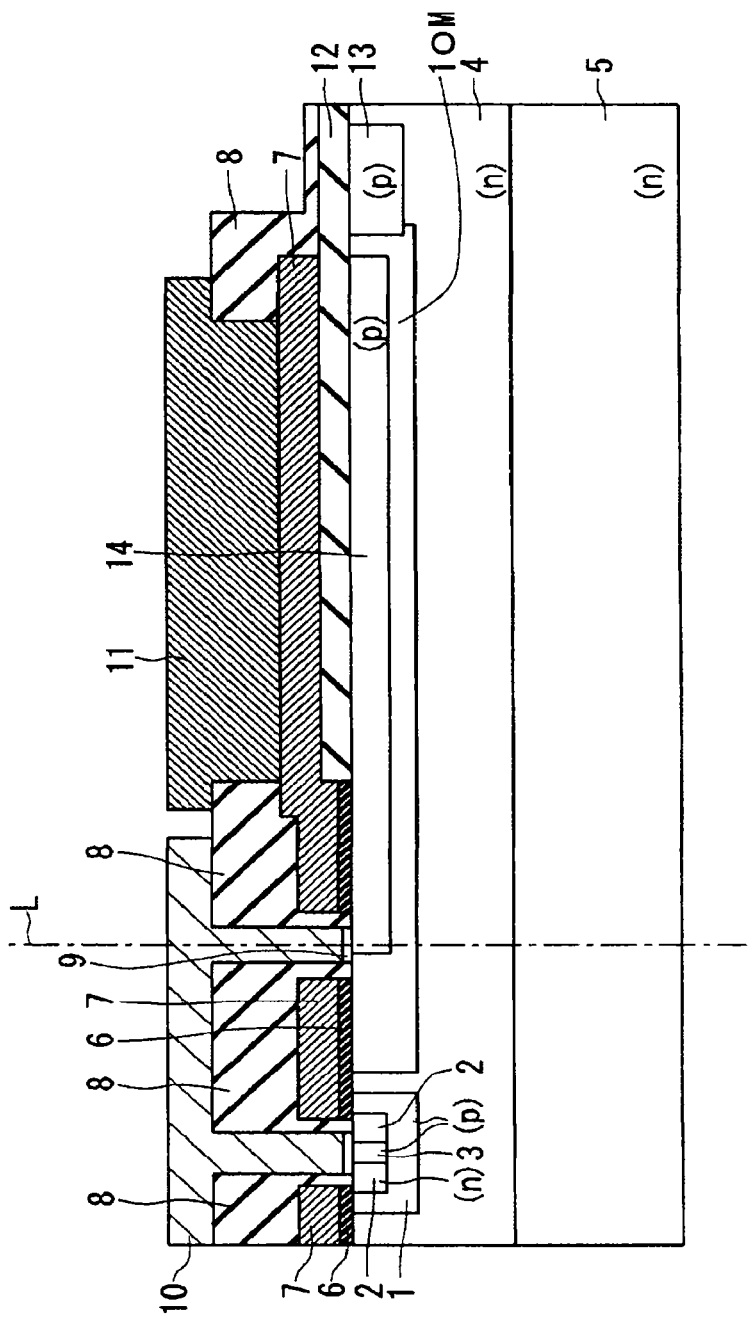
FIG. 37 is a plan view for explaining a structure of Modification 2 of the SiC-MOSFET according to Embodiment 3 of the present invention.
Figure 38:
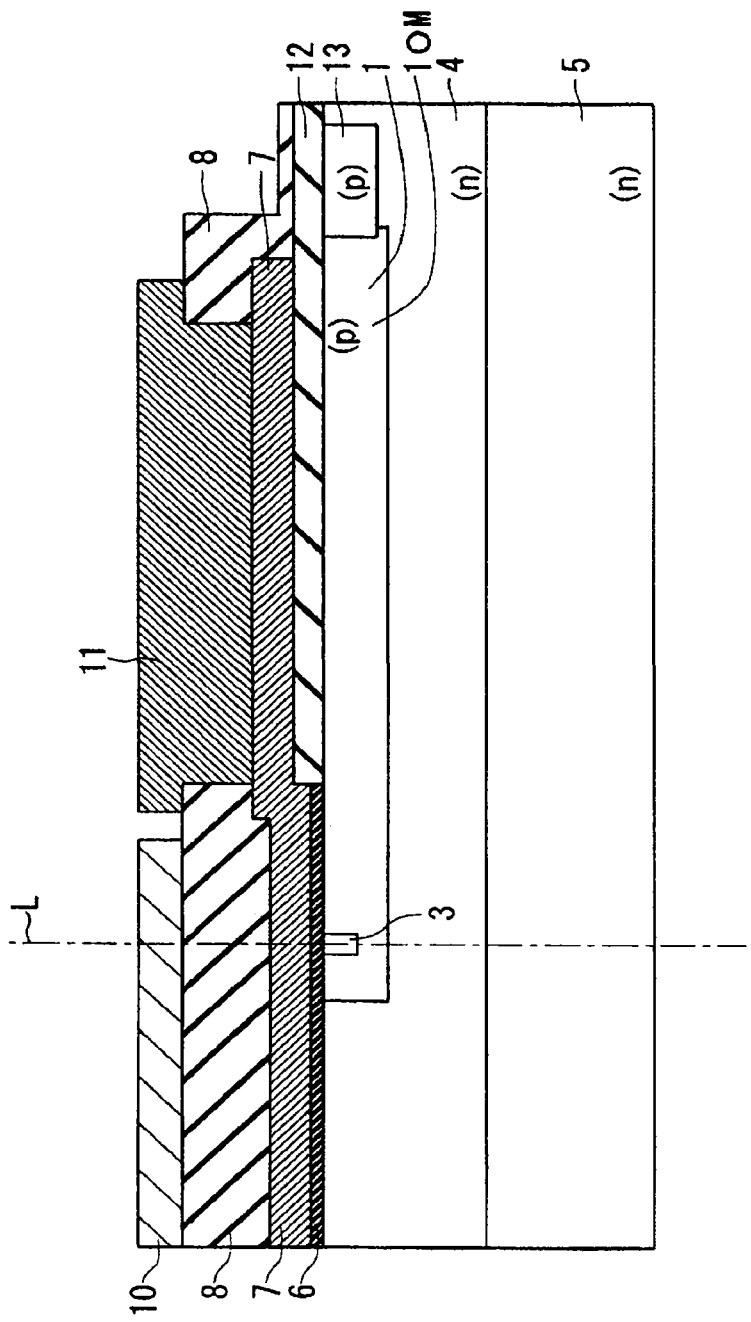
FIG. 38 is a plan view for explaining a structure of Modification 2 of the SiC-MOSFET according to Embodiment 3 of the present invention.
Figure 39:
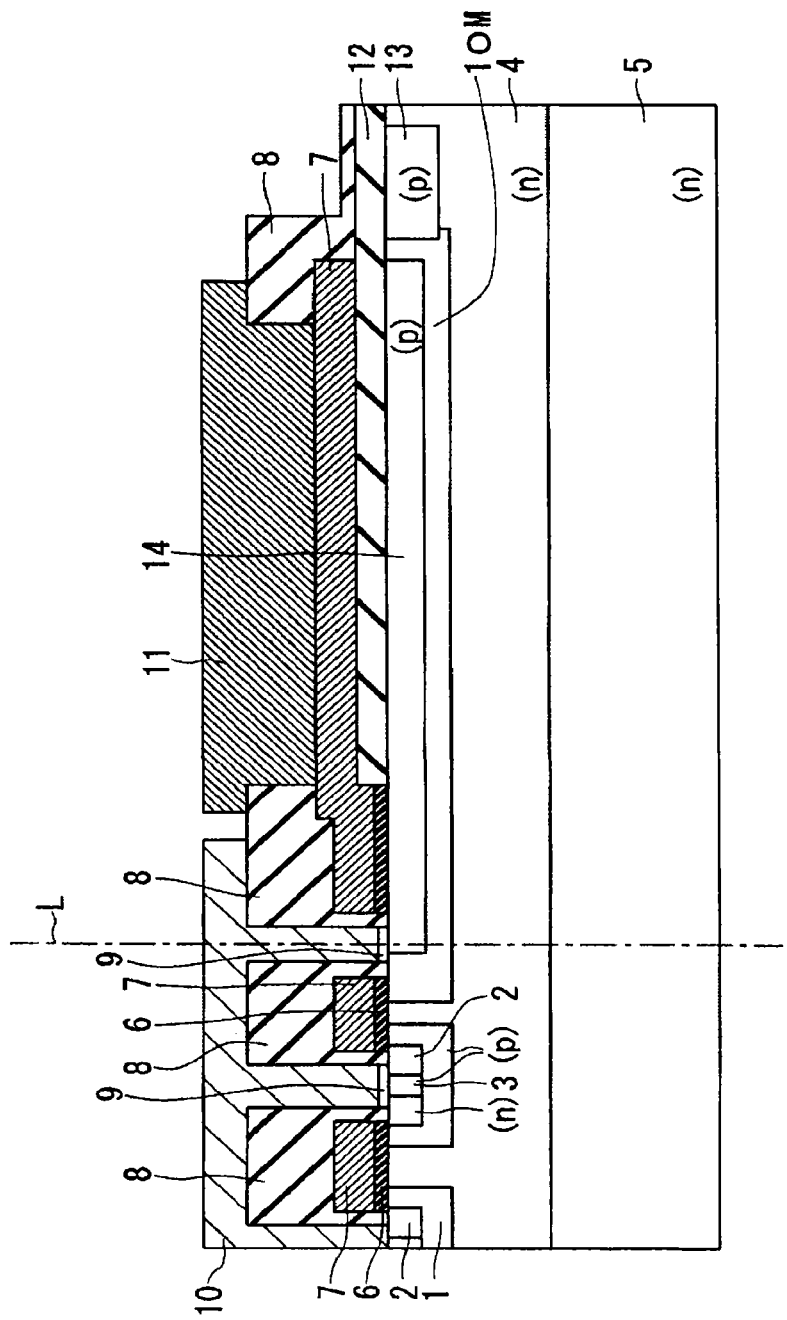
FIG. 39 is a plan view for explaining a structure of Modification 2 of the SiC-MOSFET according to Embodiment 3 of the present invention.

FIGS. 37, 38, and 39 illustrate cross sectional views taken along line a-a', line b-b', and line c-c' illustrated in FIGS. 35 and 36, respectively. In addition, the position of the line A-A' illustrated in FIGS. 35 and 36 corresponds to the position of line L illustrated in FIGS. 37 to 39.

By forming the p-type semiconductor layer 14 in a comb teeth-like shape, a region in which electric field concentrates is formed in a bonded surface between the p-type well layer 1OM and the p-type semiconductor layer 14. Specifically, since corners CN are present in a portion corresponding to a portion between the comb teeth in FIG. 35, the region in which electric field concentrates is formed in the bonded surface near the corners CN. As a result, the injection of holes into the p-type well layer 1OM from the p-type semiconductor layer 14 is facilitated.

FIG. 40 corresponds to the embodiment of FIG. 2 and illustrates a channel epitaxial layer 100. Further, FIG. 41 corresponds to the embodiment of FIG. 27, and includes a channel epitaxial layer 100.

EXPLANATION OF REFERENCE NUMERALS p-type well layer, 1OM p-type well layer on outermost periphery, 2 n-type contact layer, 3 Well contact layer, 4 n-type drift layer, 5 n-type semiconductor substrate, 6 Gate insulating film, 7 Gate electrode polysilicon layer, 8 Interlayer dielectric film, 9 NiSi layer, 10 Source electrode, 11 Gate electrode pad (Gate electrode), 12 Field oxide film, 13 JTE layer, 14 p-type semiconductor layer, 15 p-type semiconductor substrate, Emitter electrode, 17 Drain electrode, 18 Collector electrode.

What is claimed:

1. A silicon carbide semiconductor device comprising:
  a silicon carbide semiconductor substrate;
  a drift layer of a first conductivity type on a main surface of said silicon carbide semiconductor substrate;
  a cell region in a part of an upper layer of said drift layer, the cell region including a plurality of MOSFET cells each functioning as a MOSFET;
  a well layer of a second conductivity type in another part of said upper layer of said drift layer;
  an insulating film over said well layer;
  a gate electrode over said cell region and said insulating film;
  an interlayer dielectric film over said gate electrode;
  a gate pad over said well layer and electrically connected to said gate electrode through a contact hole of said interlayer dielectric film, wherein a voltage produced in the well layer under the gate pad is applied to the insulating film between the well layer and the gate pad; and
  a source electrode connected to said well layer;
  wherein:
  said contact hole orthogonally projects onto said well layer,
  said well layer has a region which has a higher impurity concentration than a portion of said well layer that is not in said region,
  said gate pad is provided above the said region so as to overlap with said region, and
  said impurity concentration of said region of said well layer is in a range from $1\times10^{19}$ to $1\times10^{21}$ cm$^{-3}$.

2. The silicon carbide semiconductor device according to claim 1, further comprising:
  a channel layer of the first conductivity type on said drift layer.

3. The silicon carbide semiconductor device according to claim 1, wherein:
  an impurity of the second conductivity type in the well layer comprises aluminum.

4. The silicon carbide semiconductor device according to claim 1, wherein:
  said region of said well layer has a thickness of 100 nm or larger.

5. The silicon carbide semiconductor device according to claim 1, wherein:
  an impurity concentration of said portion of said well layer that is not in said region is in a range from $1\times10^{18}$ to $1\times10^{19}$ cm$^{-3}$.

6. The silicon carbide semiconductor device according to claim 1,
  wherein said region of the well layer extends to a point that is below the gate pad.

* * * * *